(12) United States Patent
Hu et al.

(10) Patent No.: US 9,324,728 B2
(45) Date of Patent: Apr. 26, 2016

(54) THREE-DIMENSIONAL VERTICAL GATE NAND FLASH MEMORY INCLUDING DUAL-POLARITY SOURCE PADS

(71) Applicant: MACRONIX INTERNATIONAL CO., LTD., Hsinchu (TW)

(72) Inventors: Chih-Wei Hu, Miaoli (TW); Teng-Hao Yeh, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 106 days.

(21) Appl. No.: 14/324,842

(22) Filed: Jul. 7, 2014

(65) Prior Publication Data

US 2016/0005758 A1    Jan. 7, 2016

(51) Int. Cl.
    *H01L 27/115*      (2006.01)
    *G11C 16/06*      (2006.01)
    *G11C 16/04*      (2006.01)

(52) U.S. Cl.
    CPC ...... *H01L 27/11582* (2013.01); *H01L 27/1157* (2013.01)

(58) Field of Classification Search
    CPC .............. H01L 27/1157; H01L 27/11578; H01L 27/11582; G11C 16/04; G11C 16/0466; G11C 16/06
    See application file for complete search history.

(56) References Cited

U.S. PATENT DOCUMENTS

| | | | |
|---|---|---|---|
| 8,503,213 B2 | 8/2013 | Chen et al. | |
| 8,659,944 B2 * | 2/2014 | Hung | G11C 16/0466 365/185.05 |
| 9,076,535 B2 * | 7/2015 | Hu | G11C 16/10 |
| 9,117,526 B2 * | 8/2015 | Lai | G11C 16/06 |
| 2012/0051137 A1 | 3/2012 | Hung et al. | |
| 2012/0068241 A1 | 3/2012 | Sakuma et al. | |
| 2012/0327714 A1 * | 12/2012 | Lue | G11C 5/02 365/185.17 |

OTHER PUBLICATIONS

Barbuscia, G.P., et al., "Modeling of Polysilicon Dopant Diffusion for Shallow-Junction Bipolar Technology," 1984 International Electron Devices meeting, vol. 30, IEDM, Dec. 9-12, 1984, 4 pages.
Chen et al., "A highly scalable 8-layer Vertical Gate 3D NAND with split-page bit line layout and efficient binary-sum MiLC (Minimal Incremental Layer Cost) staircase contacts," 2012 IEEE Int'l Electron Devices Meeting, Dec. 10-13, 2012, 4 pages.

(Continued)

*Primary Examiner* — Allison P Bernstein

(74) *Attorney, Agent, or Firm* — Haynes Beffel & Wolfeld LLP

(57) ABSTRACT

A memory includes a three-dimensional array including a plurality of levels is described. Each level includes a bit line pad, a source line pad, and a plurality of strips of semiconductor material extending between the bit line pad and the source line pad. The source line pad includes at least one n-type region and at least one p-type region. The memory includes word lines coupled to the plurality of strips in the plurality of levels. The memory includes data storage elements between the word lines and the strips of semiconductor material, whereby memory cells are disposed at cross-points of the strips and the word lines. The memory also includes circuitry coupled to the n-type region and the p-type region of the source line pad, configured to selectively enable current flow in the strips extending from the source line pad and one of the n-type region and the p-type region.

20 Claims, 30 Drawing Sheets

(56) References Cited

OTHER PUBLICATIONS

Chen, Chih-Ping, et al., "A Highly Pitch Scalable 3D Vertical Gate (VG) NAND Flash Decoded by a Novel Self-Aligned Independently Controlled Double Gate (IDG) String Select Transistor (SSL)," 2012 Symp. on VLSI Technology (VLSIT), Jun. 12-14, 2012. 91-92.

U.S. Appl. No. 13/936,729, filed on Jul. 8, 2013, 60 pages.

* cited by examiner

US 9,324,728 B2

THREE-DIMENSIONAL VERTICAL GATE NAND FLASH MEMORY INCLUDING DUAL-POLARITY SOURCE PADS

TECHNICAL FIELD

This disclosure relates to three-dimensional integrated circuit memory.

DESCRIPTION OF RELATED ART

Three-dimensional or 3D memory devices have been developed in a variety of configurations that include a plurality of thin film, active strips separated by insulating material. One type of 3D memory device that uses thin film transistors as the memory cells is known as a 3D vertical gate structure such as is described in a NAND flash configuration in U.S. patent application Ser. No. 13/078,311 filed 1 Apr. 2011, now U.S. Pat. No. 8,503,213, entitled MEMORY ARCHITECTURE OF 3D ARRAY WITH ALTERNATING MEMORY STRING ORIENTATION AND STRING SELECT STRUCTURES which is incorporated by reference as if fully set forth herein. The 3D vertical gate structure includes a plurality of stacks of thin film strips with word line structures that overlie the stacks, such that the portions of the word line structures that extend vertically between the stacks act as the word lines for the memory cells at the cross-points with the strips. Thin film memory cells, such as used in 3D vertical gate NAND flash memory, may be operated in a manner that requires n-type carriers for some operations, such as read and program, and p-type carriers for other operations, such as erase.

The thin film cells in the 3D vertical gate structure and other high density memory structures, may have channel bodies that are lightly doped or intrinsic undoped, semiconductor. Also, some memory array configurations have junction free bodies. For example the 3D vertical gate NAND flash memory structure described in the above mentioned U.S. Pat. No. 8,503,213, utilized thin film strips without doped junctions between the cells in the NAND string. As a result of these structures, thin film memory cells may have channel bodies with low carrier concentrations, and without fast current paths available to provide the needed carriers.

The speed of operation of some memory cells can be limited when the charge carrier concentration is low or slow to build up when needed.

It is desirable to provide a structure for a three-dimensional integrated circuit memory with fast speed.

SUMMARY

A thin film memory cell structure is described, which comprises a strip of strip of semiconductor material extending between a source line pad and a bit line pad. A gate, such as a crossing word line, is disposed on the strip, with a memory element between the gate and the strip. In a structure described herein, there are a plurality of crossing word lines and corresponding memory elements, and the strip is junction-free between the word lines. The source pad includes an n-type region and a p-type region. Circuitry is coupled to the n-type region and the p-type region of the source line pad, configured to selectively enable current flow in the strips extending from the source line pad and one of the n-type region and the p-type region. As a result, an efficient source of p-type carriers and of n-type carriers is provided in proximity to the memory cells, enabling faster operations.

A memory including a 3D array of memory cells is described. The 3D array includes a plurality of levels. Each level includes a bit line pad, a source line pad, and a plurality of strips of semiconductor material extending between the bit line pad and the source line pad. The source line pad includes at least one n-type region and at least one p-type region. The memory includes a plurality of word lines coupled to the plurality of strips in the plurality of levels. The memory includes data storage elements between the word lines and the strips of semiconductor material, whereby memory cells are disposed at cross-points of the strips and the word lines. The memory also includes circuitry coupled to the n-type region and the p-type region of the source line pad, configured to selectively enable current flow in the strips extending from the source line pad and one of the n-type region and the p-type region.

Other aspects and advantages of the present technology can be seen on review of the drawings, the detailed description and the claims, which follow.

DETAILED DESCRIPTION

A detailed description of embodiments of the present technology is provided with reference to the Figures.

Figure 1:
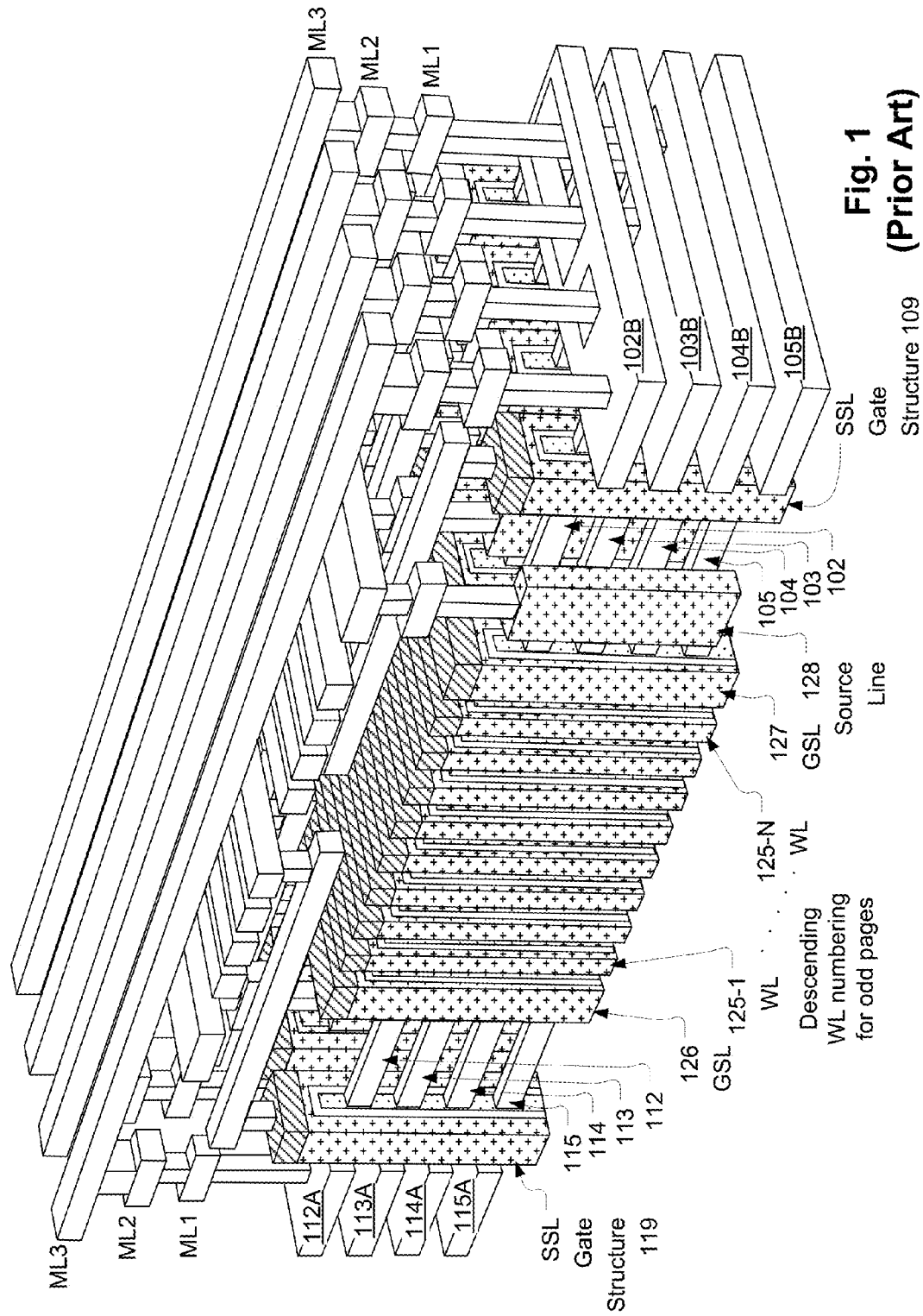
FIG. 1 is a perspective illustration of a prior art 3D NAND memory array structure including thin film active strips.

FIG. 1 is a perspective illustration of a 3D NAND memory array structure including thin film active strips, as described in prior art U.S. Pat. No. 8,503,213 referred above. Insulating material is removed from the drawing to expose additional structure for illustrative purposes. For example, insulating layers are removed between the active strips (e.g. 112-115) in stacks, and are removed between the stacks of active strips.

The multi-level array is formed on an insulating layer, and includes a plurality of word lines 125-1 WL . . . 125-N WL conformal with the plurality of stacks. The plurality of stacks includes active strips 112, 113, 114, 115, that comprise thin film strips of semiconductor material having a relatively low concentration of impurities, or alternatively of intrinsic semiconductor material configured to act as channels for the NAND strings. The portions of the word line structures that extend vertically around the stacks act as vertical gates of the word lines for memory cells at cross-points with the strips. The memory devices can be configured for n-channel or p-channel operation. The active strips do not include source/drain contacts between the word lines in some example structures, and are therefore termed "junction-free" strips. Also, the active strips are not connected to a semiconductor substrate, or other semiconductor body, and therefore can be considered to be "floating" when no voltage is applied to them via the string select or ground select switches.

Active strips in the same level are electrically coupled together by a pad arranged to have a landing area for contact to an interlayer connector. The pads at multiple levels can be arranged in stairstep structures as shown in FIG. 1, with the landing area on each successive pad disposed on a step of the structure. Landing areas for connection of the pads and the interlayer connectors to the landing areas on the pads can be arranged in patterns other than a simple stairstep, if desired or needed for a particular manufacturing setting.

The shown word line numbering, ascending from 1 to N going from the back to the front of the overall structure, applies to even memory pages. For odd memory pages, the word line numbering descends from N to 1 going from the back to the front of the overall structure.

Pads 112A, 113A, 114A, 115A terminate alternate active strips, such as active strips 112, 113, 114, 115 in each level in this example. As illustrated, these pads 112A, 113A, 114A, 115A or so-called bit line pads are electrically connected to different bit lines for connection to decoding circuitry to select planes within the array. These pads 112A, 113A, 114A, 115A can be patterned at the same time that the plurality of stacks are defined.

Pads 102B, 103B, 104B, 105B terminate the other alternate active strips, such as active strips 102, 103, 104, 105 in each level. As illustrated, these pads (bit line pads) 102B, 103B, 104B, 105B are electrically connected to different bit lines for connection to decoding circuitry to select planes within the array. These pads 102B, 103B, 104B, 105B can be patterned, with possible the exception of vias to the landing areas, at the same time that the plurality of stacks are defined.

In other examples, all the active strips in a block can terminate at bit line pads on the same end.

Any given stack of active strips is coupled to either the pads 112A, 113A, 114A, 115A, or the pads 102B, 103B, 104B, 105B, but not both, in the illustrated example. A stack of active strips has one of the two opposite orientations of bit line end-to-source line end orientation, or source line end-to-bit line end orientation. For example, the stack of active strips 112, 113, 114, 115 has bit line end-to-source line end orientation; and the stack of active strips 102, 103, 104, 105 has source line end-to-bit line end orientation.

The stack of active strips 112, 113, 114, 115 is terminated at one end by the pads 112A, 113A, 114A, 115A, passes through SSL gate structure 119, ground select line GSL 126, word lines 125-1 WL through 125-N WL, ground select line GSL 127, and is terminated at the other end by source line 128. The stack of active strips 112, 113, 114, 115 does not reach the pads 102B, 103B, 104B, 105B.

The stack of active strips 102, 103, 104, 105 is terminated at one end by the pads 102B, 103B, 104B, 105B, passes through string select SSL gate structure 109, ground select line GSL 127, word lines 125-N WL through 125-1 WL, ground select line GSL 126, and is terminated at the other end by a source line (obscured by other parts of figure). The stack of active strips 102, 103, 104, 105 does not reach the pads 112A, 113A, 114A, 115A.

A layer of memory material separates the word lines 125-1 WL through 125-N WL, from the active strips 112-115 and 102-105. Ground select lines GSL 126 and GSL 127 are conformal with the plurality of active strips, similar to the SSL gate structures.

Every stack of active strips is terminated at one end by bit line pads, and at the other end by a source line. For example, the stack of active strips 112, 113, 114, 115 is terminated at one end by bit line pads 112A, 113A, 114A, 115A, and terminated on the other end by source line 128. At the near end of the figure, every other stack of active strips is terminated by the bit line pads 102B, 103B, 104B, 105B; and every other stack of active strips is terminated by a separate source line. At the far end of the figure, every other stack of active strips is terminated by the bit line pads 112A, 113A, 114A, 115A, and every other stack of active strips is terminated by a separate source line.

Bit lines and string select lines are formed at patterned conductor layers, such as metals layers ML1, ML2, and ML3. Transistors are formed at cross-points between the active strips (e.g. 112-115) and the word line 125-1 WL through 125-N WL. In the transistors, the active strip (e.g. 113) acts as the channel region of the device.

String select gate structures (e.g. 119, 109) can be patterned during the same step that the word lines 125-1 WL through 125-N WL are defined. Transistors are formed at cross-points between the active strips (e.g. 112-115) and the string select gate structures (e.g. 119, 109). These transistors act as string select switches coupled to decoding circuitry for selecting particular stacks in the array.

A charge storage layer structure is disposed at least in the cross-points in which memory cells are formed. The charge storage layer structure can comprise a multilayer dielectric charge storage structure such as silicon-oxide-nitride-oxide-silicon (SONOS) like structures. One dielectric charge storage structure is known as bandgap engineered SONOS, or "BE-SONOS." A BE-SONOS charge storage structure can include a multilayer tunneling layer, such as a layer of silicon oxide about 2 nm thick, a layer of silicon nitride about 2 to 3 nm thick and a layer of silicon oxide about 2 to 3 nm thick. A BE-SONOS structure includes a dielectric layer for storing (trapping) charge on the multilayer tunneling layer, such as a layer of silicon nitride about 5 to 7 nm thick. Also, a BE-SONOS structure includes a dielectric layer for blocking charge leakage on the charge storage layer, such as a layer of silicon oxide about 5 to 8 nm thick. Other materials may be utilized as well in the BE-SONOS stack.

In a device including a BE-SONOS charge storage layer, an erasing operation can include FN tunneling holes from the channel to the charge storage layer to compensate the trapped electrons in the charge storage layer.

However, for a structure like that shown in FIG. 1, there is no P+ region within active strips that can provides holes for FN tunneling. Memory cells along an active strip do not have a transistor body that can provide a sufficient channel potential for generating erase currents that mostly compose of holes as charge carriers. As described herein, a dual-polarity source pad structure is provided for a 3D memory array structure to act as a source of holes and of electrons, depending on different bias conditions. The dual-polarity source pad structure can act as a source of holes during an erase operation such that memory cells of the 3D array that are being erased operate in p-channel mode. The dual-polarity source pad structure can also act as a source of electrons during a read operation such that selected memory cell of the 3D array operate in re-channel mode.

Figure 2:
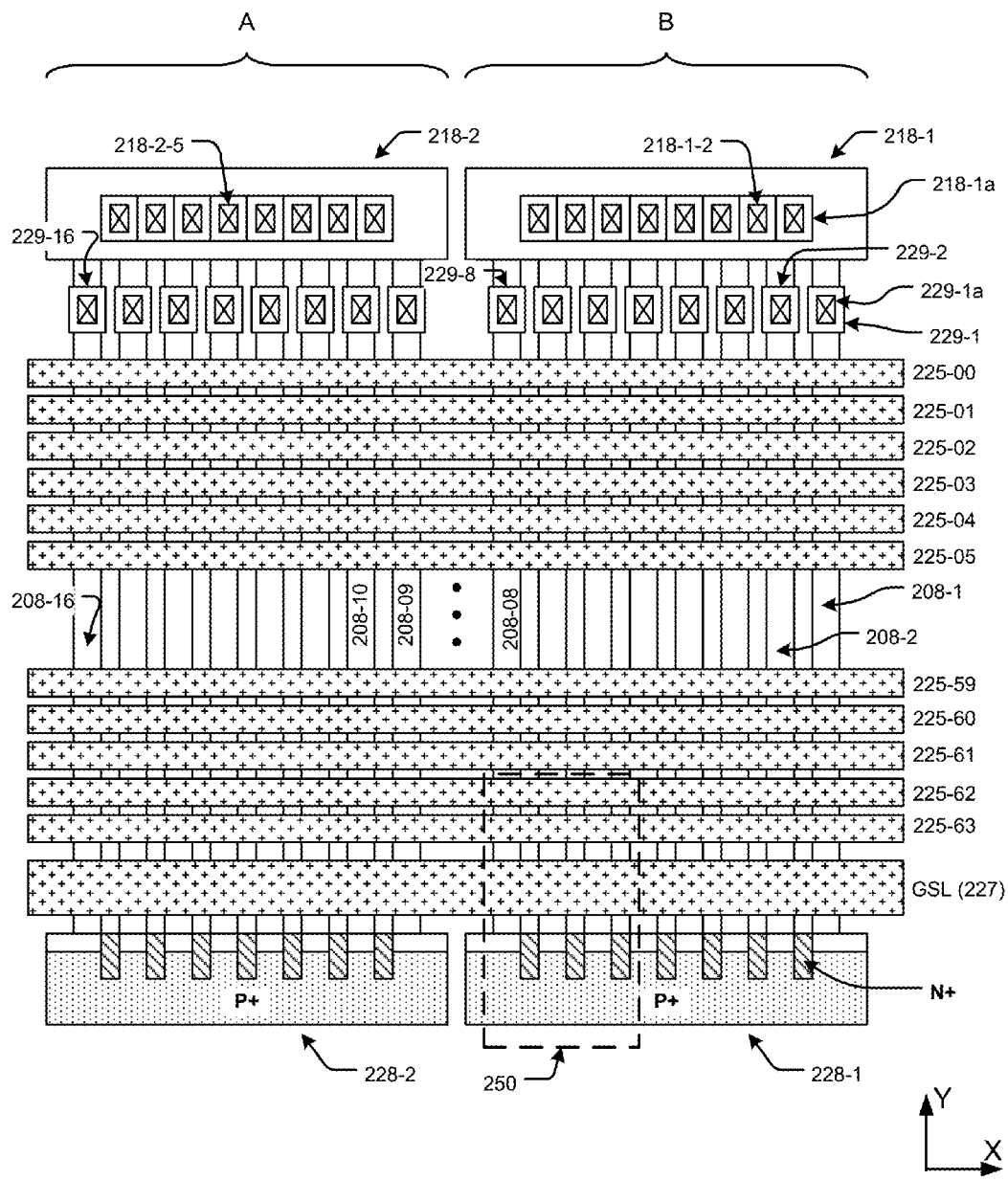
FIGS. 2 and 3 are layout views of a 3D vertical gate memory array including dual-polarity source pad structures.

FIG. 2 is a layout view of a 3D vertical gate memory array including dual-polarity source pad structures. In the layout view of FIG. 2, the array includes a plurality of active strips (e.g., 208-1, 208-2 ... 208-16) at a plurality of levels, forming stacks of active strips. The active strips comprise thin film strips of semiconductor material configured to act as channels for NAND strings. The semiconductor strips are lightly doped (e.g., with a relatively low concentration of impurities, such as a doping concentration of about $10^{13}$ cm$^{-3}$), or alternatively is of an intrinsic, undoped, semiconductor material. The active strips do not include more-heavily doped regions between the word lines, and are thus considered junction-free.

Word lines (e.g., 225-00, 225-01 ... 225-63) coupled to the plurality of active strips in the plurality of levels are disposed in a direction perpendicular to the active strips' direction and conformal to the active strip stacks. Data storage elements such as dielectric charge storage structures described earlier are disposed between the word lines and the active strips. Memory cells are formed at cross-points of the active strips and the word lines. The portions of the word lines that extend vertically around the stacks act as vertical gates for the memory cells. In this example, there are two blocks of cells (labeled A and B), each having for the purposes of illustration, eight stacks of active strips eight levels deep. Note that only top-level active strips are shown in the layout view of FIG. 2. In other embodiments, there may be more or less levels of active strips such as 2, 4, or 16. There may be more or less stacks of strips per block, such as 4 or 16. There may be more or less word lines intersecting a block, such as 16, 32, or 128.

For reference, the "X" axis lies in the horizontal direction parallel to the word lines in the array, the "Y" axis lines in the horizontal direction parallel to the active stripes in the array, and the "Z" axis lies in the vertical direction (i.e., pointing out of FIG. 2) orthogonal to the word lines and to the active strips in the array.

In this example, active strips at each level of each block extend from a source line pad, or so-called dual-polarity source pad as described herein, to a bit line pad. For example, active strips at the top level of block B (active strips 208-1, 208-2 ... 208-8) extend, in the Y-axis direction, from a dual-polarity source pad 228-1 to a bit line pad 218-1. Similarly, active strips at the top level of block A (active strips 208-9, 208-10 ... 208-16) extend from a dual-polarity source pad 228-2 to a bit line pad 218-2.

Active strips in a particular lower level of the array extend from a corresponding dual-polarity source pad at the particular lower level to a corresponding bit line pad at the particular lower level. The bit line pads for each block in the array can be arranged in a stairstep structure (e.g., 218-1a) as similarly illustrated in FIG. 1, with the landing area for each successive bit line disposed on a step of the stairstep structure. Landing areas for connection of the bit line pads and interlayer connectors (e.g., 218-1-2, 218-2-5) to the landing areas can be arranged in patterns of a simple stairstep or other suitable patterns. These interlayer connectors couple the bit line pads to overlying bit lines in a patterned conductor layer (e.g., ML3 shown in FIG. 1). The overlying bit lines are connected to peripheral circuits supporting operations of the 3D vertical gate memory array. For example, these interlayer connectors can couple the bit line pads to overlying patterned conductors that connect to a page buffer. The page buffer can store data that is written to or read from selected memory cells in the 3D vertical gate memory array.

Overlying and conformal to the active strips are word lines and ground select line GSL 227 in the X-axis direction. In this example, the ground select line GSL 227 control electrical connection between the active strips and their corresponding source line pads. The 3D memory array also includes string select line SSL gate structures (e.g., 229-1, 229-2 ... 229-16). Each SSL gate structure overlays a corresponding stack of active strips. In this example, each SSL gate structure overlays a corresponding stack of eight active strips. The SSL gate structures control electrical connection between any active strip (e.g., 208-2) and the active strip's corresponding bit line pad (e.g., 218-1). Interlayer connectors (e.g., 229-1a) couple the SSL gate structures to overlying SSL lines in a patterned conductor layer (e.g., ML2 shown in FIG. 1).

Each dual-polarity source pad (e.g., 228-1) includes at least one n-type region and at least one p-type region, as described in more detail below with FIG. 3. The n-type and the p-type regions are doped sufficient to act as sources of n-type or p-type charge carriers flowing through active strips (e.g., 208-1, 208-2) extending from the dual-polarity source pad during operations of the 3D vertical gate memory array of FIG. 2. For example, the n-type region of the dual-polarity source pad can have one or more N+ doped regions that have higher n-type impurity concentration than the active strips extending from the dual-polarity source pad. The p-type region of the dual-polarity source pad can have one or more P+ doped regions that have higher p-type impurity concentration than the active strips extending from the dual-polarity source pad. The N+ and P+ regions can be highly doped, with a doping concentration of about $10^{18}$ cm$^{-3}$ or higher. The active strips (e.g., 208-1, 208-2 . . . 208-16) can be more lightly doped than the n-type region and the p-type region. The n-type region and the p-type region are coupled to circuitry that is configured to selectively enable current flow in the active strips extending from the dual-polarity source pad and one of the n-type region and the p-type region, as described in more detail below.

Figure 3:
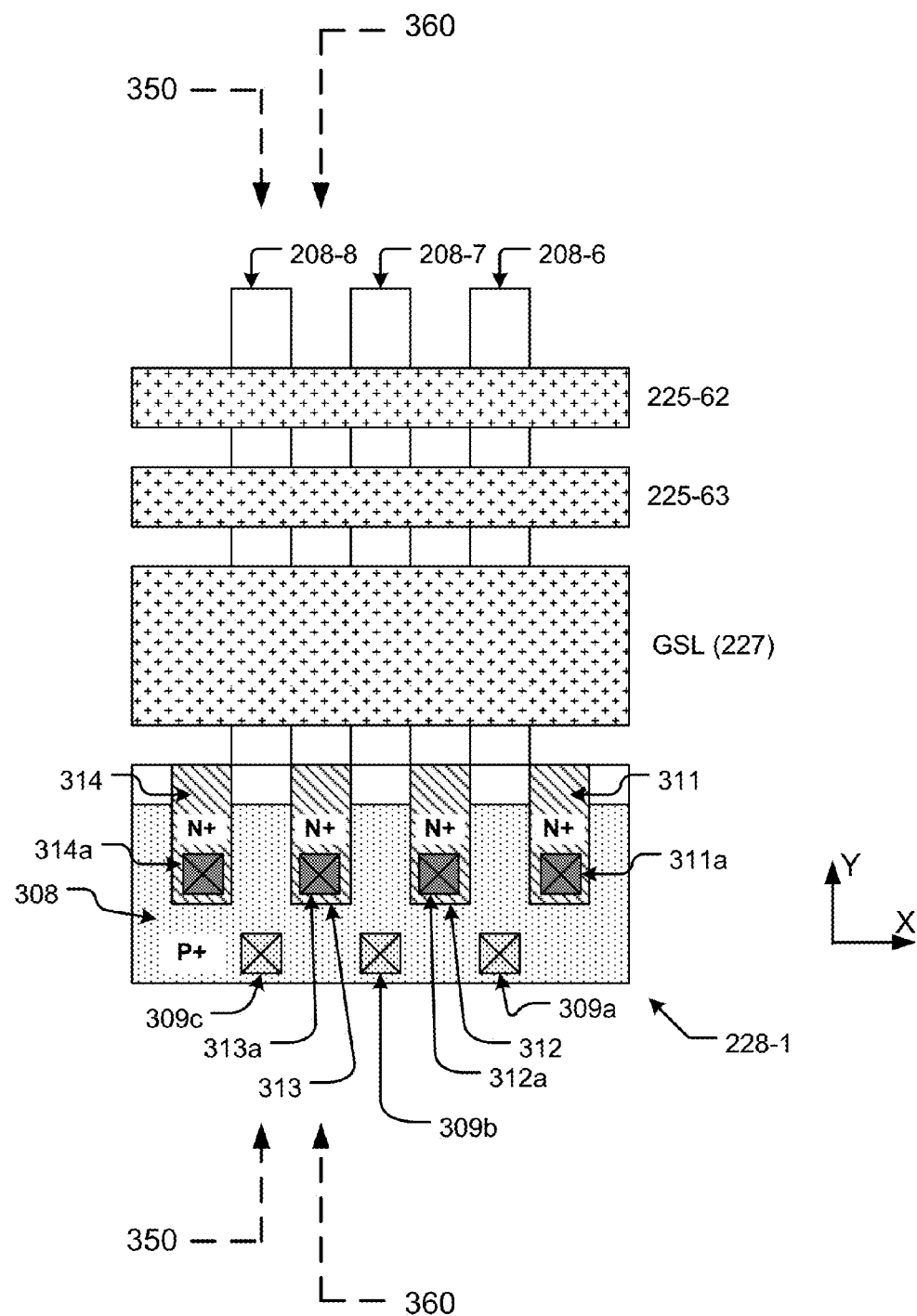

FIG. 3 is another layout view of the example 3D vertical gate memory array including dual-polarity source pad structures shown in FIG. 2. FIG. 3 illustrates the region 250 shown in FIG. 2 in more detail. In the example of FIG. 3, the dual-polarity source pad 228-1 includes a P+ region 308 and multiple discrete N+ regions (e.g., 311, 312, 313, and 314) separated from one another by P+ regions in this illustration. The P+ region is adjacent to one or more of the active strips (e.g., 208-6, 208-7, 208-8) extending from the source pad 228-1. The discrete N+ regions interleave the P+ region. Each of the N+ regions is also adjacent to at least one of the active strips extending from the source pad 228-1. As a result of this layout, each active strip includes a portion that abuts both an N+ region and a P+ region.

The dual-polarity source pad 228-1 includes interlayer connectors (e.g., 309a, 309b, and 309c) connecting the P+ region 308 to overlying control lines in a patterned conductor layer (e.g., ML2). The dual-polarity source pad 228-1 also includes interlayer connectors (e.g., 311a, 312a, 313a, and 314a) connecting respective N+ regions (e.g., 311, 312, 313, and 314) to overlying control lines in a patterned conductor layer (e.g., ML2).

In addition to the 3D NAND memory array structure illustrated in FIG. 1, the dual-polarity source pad structure of FIG. 3 can also be used for single level arrays, or even for a single strip. Also, the dual-polarity source pad structure of FIG. 3 can also be used for other 3D NAND memory array structures, such as ones described in Shih-Hung Chen et al. "A Highly Scalable 8-layer Vertical Gate 3D NAND with Split-page Bit Line Layout and Efficient Binary-sum MiLC (Minimal Incremental Layer Cost) Staircase Contacts," IEDM 2012 pp. 2.3.1-2.3.4, and in Chih-Ping Chen et al., "A Highly Pitch Scalable 3D Vertical Gate (VG) NAND Flash Decoded by a Novel Self-Aligned Independently Controlled Double Gate (IDG) String Select Transistor (SSL)," 2012 Symposium on VLSI Technology Digest of Technical Papers pp. 91-92.

Figure 4A:
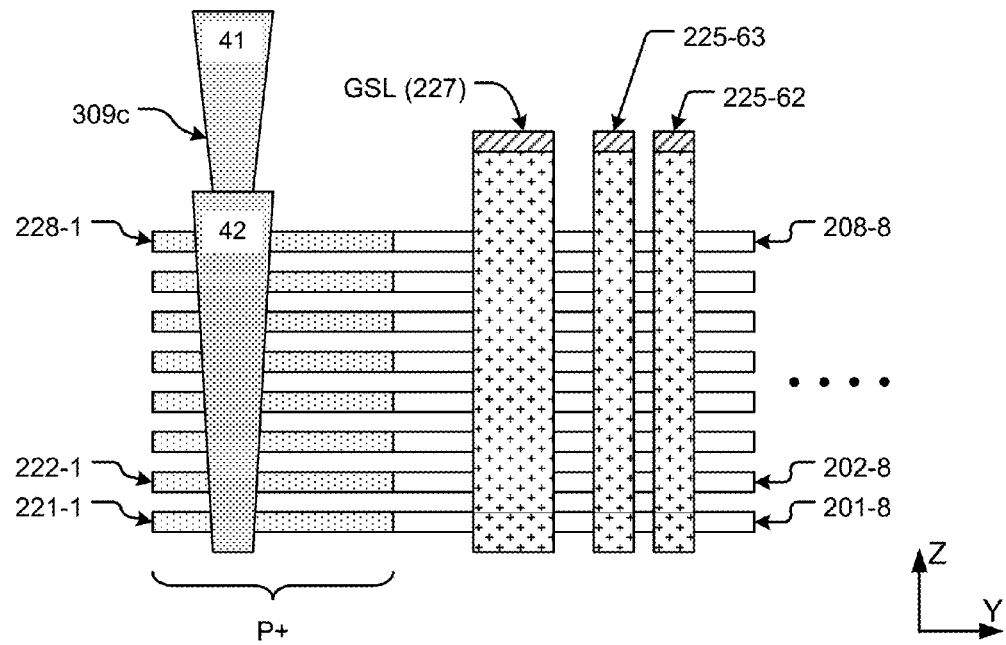
FIGS. 4A and 4B are cross-sectional views of a 3D vertical gate memory array including dual-polarity source pad structures.
Figure 4B:
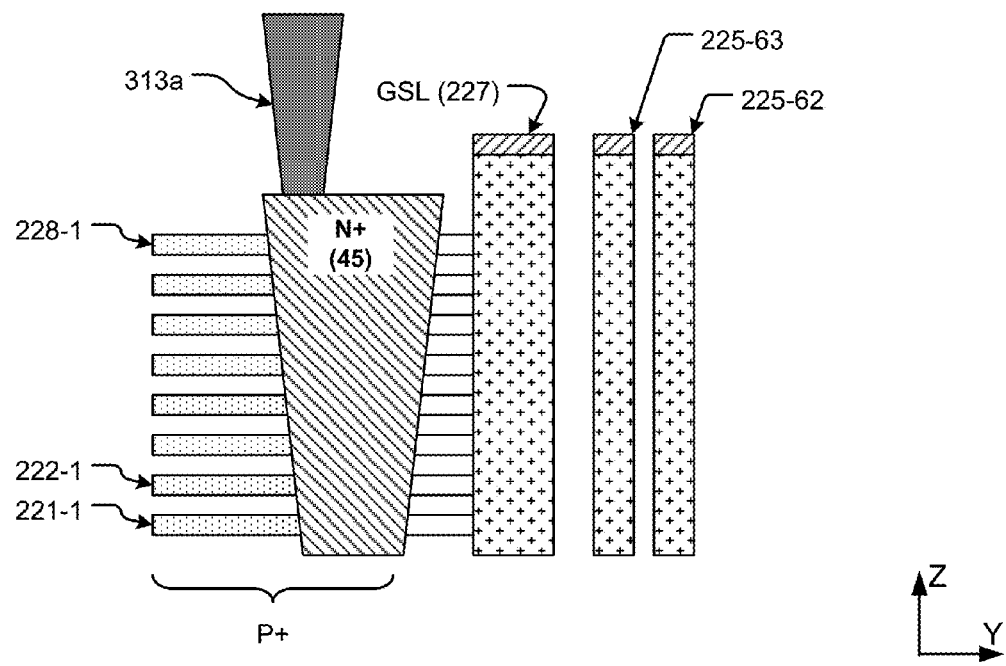

FIGS. 4A and 4B are cross-sectional views of a 3D vertical gate memory array including dual-polarity source pad structures. FIG. 4A illustrates a cross-sectional view of the cross section 350 along an active strip 208-8, passing between two discrete N+ regions 313 and 314, passing through the interlayer connector 309c shown in FIG. 3. In the example of FIG. 4A, the active strip at a particular level extends (in the X-axis direction) from a corresponding dual-polarity source pad at the particular level and is coupled to GSL line 227 and word lines (e.g., 225-63, 225-62, and so on). For example, the top-level active strip 208-8 extends from the top-level dual-polarity source pad 228-1. The active strip 202-8 extends from the dual-polarity source pad 222-1 at the same level. The bottom-level active strip 201-8 extends from the bottom-level dual-polarity source pad 221-1. In this example, interlayer connector 309c (including two vertical connectors 41 and 42) connects the P+ regions in the dual-polarity source pad at every level to overlying control lines.

FIG. 4B illustrates a cross-sectional view of the cross section 360 passing through the discrete N+ region 313, and between the active strips 208-8 and 208-7 shown in FIG. 3. In the example of FIG. 4B, the respective discrete N+ regions at the eight levels are composed of an N+ doped block 45. The interlayer connector 313a connects the N+ regions to overlying control lines.

During an erase operation, for example, on a block of the 3D vertical memory array illustrated in FIG. 2 (e.g., block B), all SSL gate structures of the block (e.g., 229-1, 229-2 . . . 229-8) are turned off (i.e., biased to zero volt or left floating). Negative gate bias voltages are applied to the GSL line (e.g., 227) and word lines (e.g., 225-00, 225-01 . . . 225-63) of the block. The N+ regions of the dual-polarity source pads at all levels of the block (e.g., 221-1, 222-1 . . . 228-1) remain floating. A positive bias is applied to the P+ regions of the dual-polarity source pads at all levels of the block, thus providing a positive channel potential along the lengths of the active strips. Moreover, the positive-biased P+ regions (of the dual-polarity source pads) act as a source of holes (p-type carriers) that are conducted through the active strips (i.e., channels of the memory cells of the block) during the erase operation. In this way, the memory cells of the block operate in p-channel mode during the erase operation.

Figure 5:
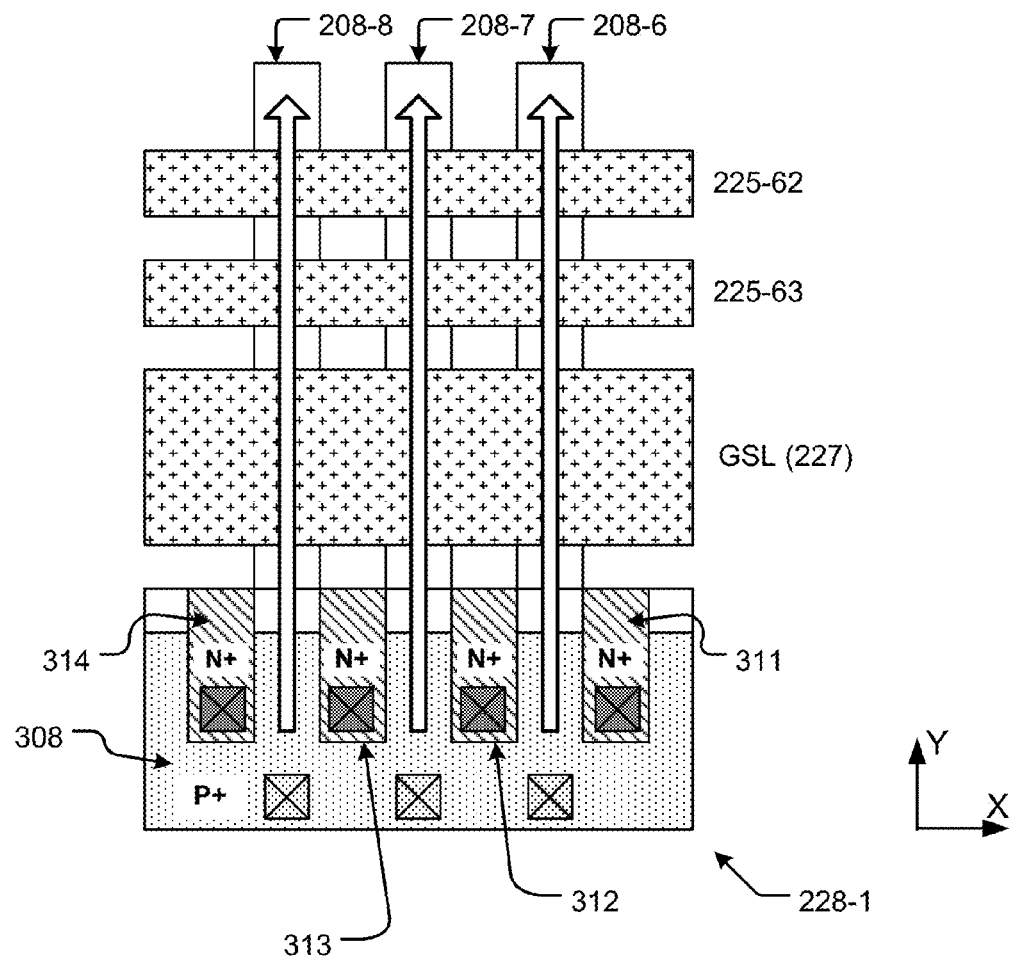
FIG. 5 illustrates an example current path during an erase operation of a 3D vertical gate memory array including dual-polarity source pad structures.

FIG. 5 illustrates an example current path during the erase operation just described for a 3D vertical gate memory array including dual-polarity source pad structures. FIG. 5 shows the detailed layout view illustrated in FIG. 3. As described above, a positive bias (e.g., 10 to 16 volts) is applied to the P+ region (308) of the dual-polarity source pad 228-1 during the example erase operation. In one embodiment, the word lines can be biased to zero volts. Meanwhile, the N+ regions (311, 312, 313, and 314) remain floating. The positive-biased P+ region supports erase current comprising holes as charge carriers. The erase currents are conducted down through the active strips (208-6, 208-7, 208-8), as illustrated by the arrows in FIG. 5.

During an example of a read operation on a selected active strip of the 3D vertical memory array illustrated in FIG. 2, the selected active strip is biased to a positive voltage (e.g., 1V) at the end of bit line pads. Meanwhile, unselected active strips are biased to zero voltage. Selected word lines are biased to a reference voltage that can be used to distinguish between an erase state and a programmed state of memory cells in the 3D vertical memory array. Unselected word lines are bias to a pass voltage that causes unselected memory cells (e.g., at the cross-points of the selected active strip and unselected word lines) operate as closed pass gates (i.e., always conducting). The SSL gate structure corresponds to the selected active strip is biased to a positive reference voltage. SSL gate structures that do not include a selected active strip are biased to zero voltage. The GSL line including the selected active strip is biased to a positive reference voltage.

During the read operation, the N+ regions of the dual-polarity source pad connected to the selected active strips are biased to zero voltage, while the P+ region of the dual-polarity source pad remains floating. With the potential difference between the bit-line-pad end (biased to 1V) and the dual-polarity source-pad end (the N+ regions are biased to 0V) of the selected active strip, a read current of electrons can flow through the selected active strip, toward the N+ regions of the dual-polarity source-pad.

Figure 6:
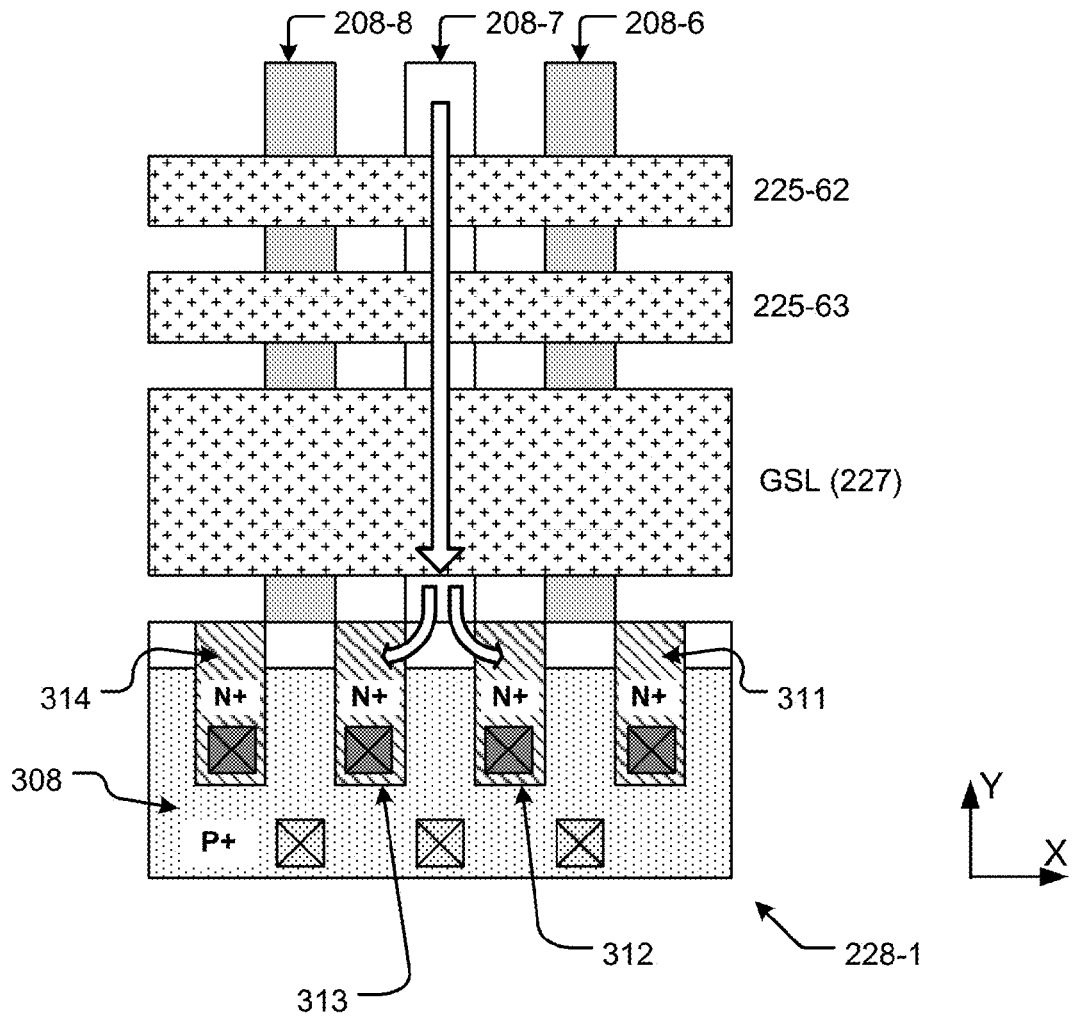
FIG. 6 illustrates an example current path during a read operation of a 3D vertical gate memory array including dual-polarity source pad structures.

FIG. 6 illustrates an example current path during a read operation of a 3D vertical gate memory array including dual-polarity source pad structures. FIG. 6 shows the detailed layout view illustrated in FIG. 3. As described above, a zero bias is applied to the N+ regions (311, 312, 313, and 314) of the dual-polarity source pad 228-1 during a read operation. Meanwhile, the P+ region 308 remains floating. In this example, active strip 208-7 is selected for the read operation, while active strips 208-6 and 208-8 are not selected for the read operation. As illustrated by the arrows shown in FIG. 6, a read current flows through the selected active strip 208-7 (i.e., channels of the memory cells along the selected active strip 208-7) if the selected memory cell is in an erased state. The read current flows through the selected active strip 208-7 from the corresponding bit line pad (not shown) to the zero-biased N+ regions of the corresponding dual-polarity source pad. Since the N+ regions are zero-biased, or negatively biased relative to the selected active strip, the charge carriers of the read current comprise electrons (n-type carriers) generated by the negative-biased N+ region. Thus the memory cells along the selected active strip operate in n-channel mode during the read operation.

During an example program operation on selected bits of the 3D vertical memory array illustrated in FIG. 2, the GSL line is biased to zero volt (i.e., turned off). Meanwhile, the P+ regions and N+ regions of the dual-polarity source pads can remain floating.

Figure 7:
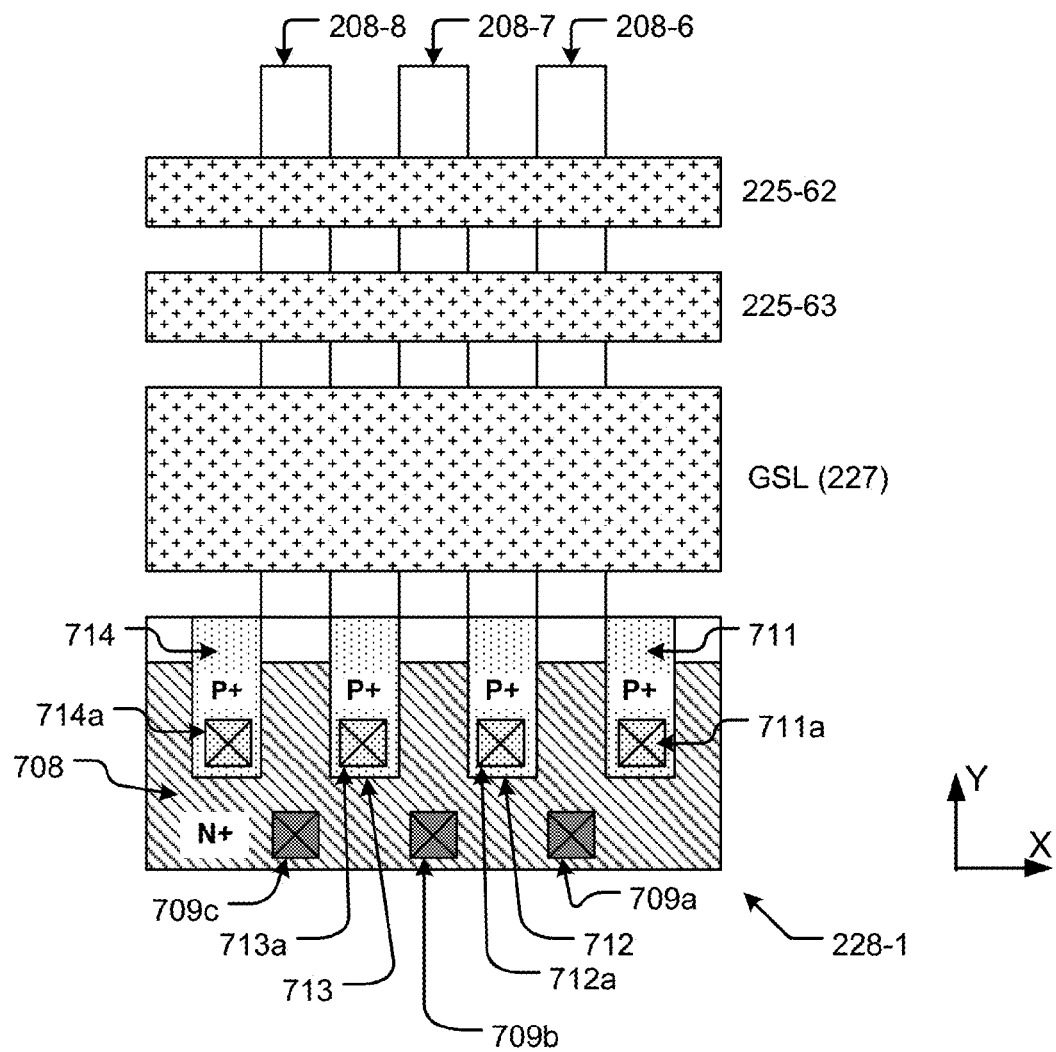
FIG. 7 is a layout view of dual-polarity source pad structures of a 3D vertical gate memory array.

FIG. 7 is a layout view of another embodiment of dual-polarity source pad structures of the 3D vertical gate memory array illustrated in FIG. 2. In the example of FIG. 7, the dual-polarity source pad 228-1 includes an N+ region 708 and multiple discrete P+ regions (e.g., 711, 712, 713, and 714). The N+ region is adjacent to one or more the active strips (e.g., 208-6, 208-7, 208-8) extending from the source pad 228-1. The discrete P+ regions interleave the N+ region. Each of the P+ regions is adjacent to at least one of the active strips extending from the source pad 228-1.

In this example, the dual-polarity source pad 228-1 includes interlayer connectors (e.g., 709a, 709b, and 709c) connecting the N+ region 708 to overlying control lines in a patterned conductor layer (e.g., ML2). The dual-polarity source pad 228-1 also includes interlayer connectors (e.g., 711a, 712a, 713a, and 714a) connecting respective P+ regions (e.g., 711, 712, 713, and 714) to overlying control lines in in a patterned conductor layer (e.g., ML2).

The present technology in the vertical gate memory array with dual-polarity source pad structures described with FIG. 2 can be embodied in a single level array, or in a single strip of semiconductor material. For example, the memory array can include only a single level, such as the top level illustrated in FIG. 2, including the source line pads (dual-polarity source pads) 228-1 and 228-2, the bit line pads 218-1 and 218-2, and the active strips 208-1, 208-2 . . . 208-16. The memory array includes word lines 225-01, 225-02 . . . 225-63 coupled to the active strips 208-1, 208-2 . . . 208-16. As described earlier, each active strip acts as channels of a NAND string and is junction-free between the word lines. The memory array also includes string select line SSL gate structures (e.g., 229-1, 229-2 . . . 229-16) between the word lines and the bit line planes, and a ground select line GSL structure (e.g., 227) between the word lines and the source line pads. The at least one n-type region and the at least one p-type region of the source line pads 228-1 and 228-2 are coupled to a circuitry that is configured to enable current flow in the active strips through one of the n-type region or the p-type region.

Figure 8:
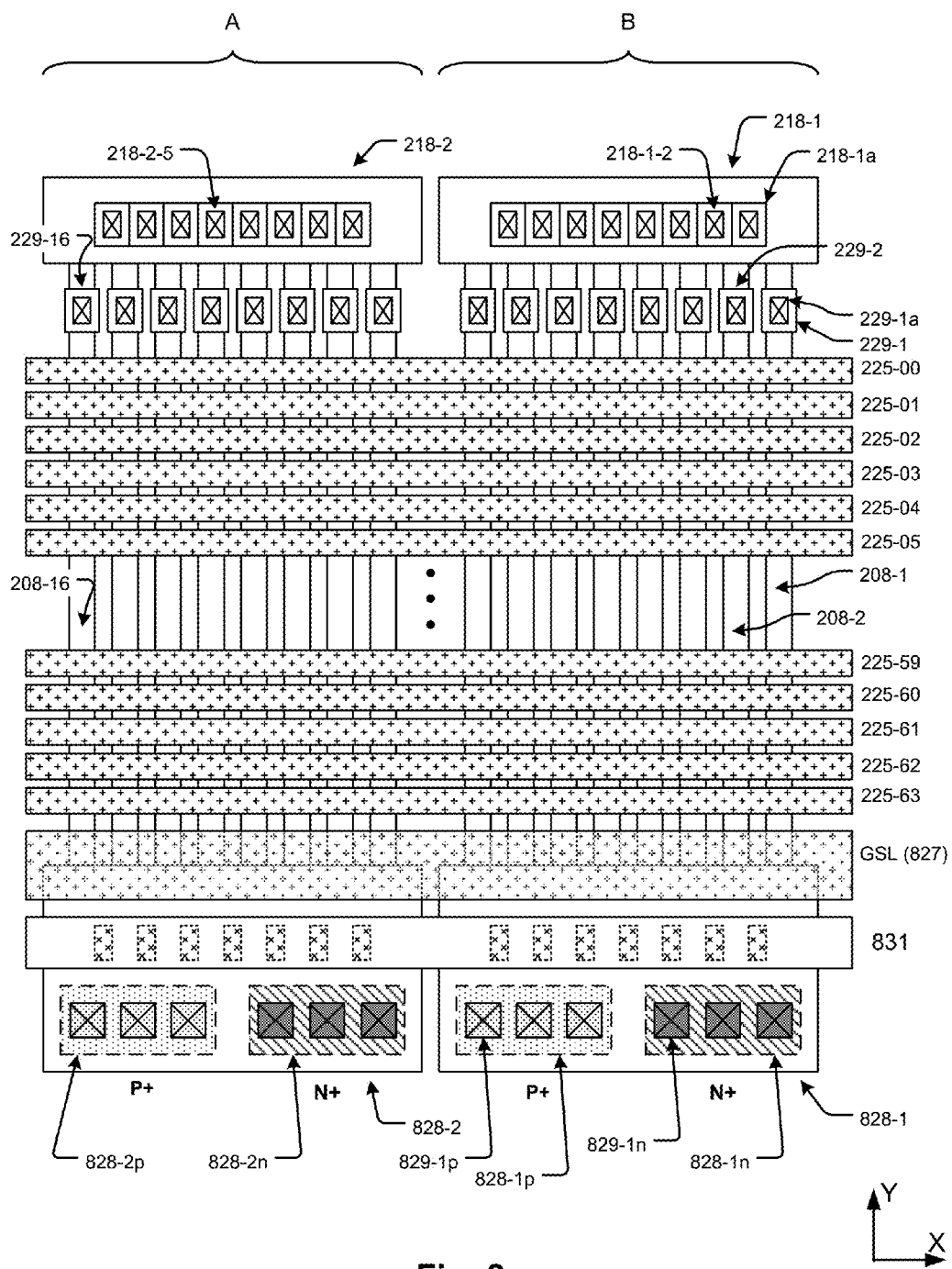
FIG. 8 is a layout view of a 3D vertical gate memory array including dual-polarity source pad structures.

For another example, the memory array can include a single active strip 208-7 between the source line pad (dual-polarity source pad) 228-1 and the bit line pad 218-1. The memory array includes at least a gate (e.g., word line 225-63) coupled to the active strip 208-7. A memory cell is formed with a data storage element between the gate and the active strip 208-7. The memory array also includes a string select line SSL gate structure (e.g., 229-7) controlling electrical connection between the active strip 208-7 and the bit line pad 218-1, and a ground select line GSL gate structure (e.g., 227) controlling electrical connection between the active strip 208-7 and the source line pad 228-1. The at least one n-type region and the at least one p-type region of the source line pad 228-1 are coupled to a circuitry that is configured to enable current flow in the active strips through one of the n-type region or the p-type region FIG. 8 is a layout view of a 3D vertical gate memory array including dual-polarity source pad structures. FIG. 8 illustrates another embodiment of dual-polarity source pad structures for the 3D vertical gate memory array illustrated in FIG. 2. In the example of FIG. 8, the 3D vertical gate memory array includes two memory cell blocks (block A and block B). Each block has eight stacks of active strips eight levels deep. The active strips (e.g., 208-1, 208-2 . . . 208-16), word lines (e.g., 225-00, 225-01 . . . 225-63), SSL gate structures (e.g., 229-1, 229-2 . . . 229-16), interlayer connectors (e.g., 229-1a) coupling the SSL gate structures to overlying SSL lines, bit line pads (e.g., 218-1, 218-2), stairstep structures (e.g., 218-1a), and interlayer connectors (e.g., 218-1-2, 218-2-5) connecting the landing pads of the stairstep structures and overlying bit lines have the same structures as the 3D vertical gate memory array illustrated in FIG. 2.

Active strips in a particular level of the array extend from a corresponding dual-polarity source pad at the particular level to a corresponding bit line pad at the particular level. For example, the top-level active strips of the block B (e.g., 208-1, 208-2 . . . 208-8) extend from the top-level dual-polarity source pad 828-1 to the top-level bit line pad 218-1. The top-level active strips of the block A (e.g., 208-9, 208-10 . . . 208-16) extend from the top-level dual-polarity source pad 828-2 to the top-level bit line pad 218-2.

In one embodiment, the bit line pads (e.g., 218-1, 218-2) comprise n-type semiconductor material, such as N+ doped semiconductor material. In addition, the active strips (e.g., 208-1, 208-2, and so on) between the bit line pads and the SSL gate structures can doped with N+ impurities. The SSL gate structures can also be doped with N+ impurities.

In this example, each dual-polarity source pad at a particular level of the 3D vertical gate memory array includes a p-type region and an n-type region. The n-type region and the p-type region are coupled to circuitry that is configured to selectively enable current flow in the active strips extending from the dual-polarity source pad and one of the n-type region and the p-type region. For example, the dual-polarity source pad 828-1 includes a P+ region 828-1p and an N+ region 828-1n. The dual-polarity source pad 828-2 includes a P+ region 828-2p and an N+ region 828-2n. The P+ region of a dual-polarity source pad have higher p-type impurity concentration than active strips extending from the dual-polarity source pad. The N+ region of a dual-polarity source pad have higher n-type impurity concentration than active strips extending from the dual-polarity source pad.

The top-level dual-polarity source pad includes one or more interlayer connectors (e.g., 829-1n) that connect the N+ region to overlying control lines in a patterned conductor layer (e.g., ML2). The top-level dual-polarity source pad includes one or more interlayer connectors (e.g., 829-1p) that connect the P+ region to overlying control lines in a patterned conductor layer (e.g., ML2).

In another embodiment, each dual-polarity source pad includes one or more p-type regions and one or more n-type regions. The p-type regions are disposed on one side (e.g., left side) of the dual-polarity source pad, while the p-type regions are disposed on the other side (e.g., right side) of the dual-polarity source pad.

The ground select line GSL structure 827 is disposed across and conformal to the active strips of each block. In one embodiment, the GSL line 827 overlaps a portion of the dual-polarity source pads that is adjacent to the active strips, as illustrated in FIG. 8.

The dual-polarity source pads (e.g., 828-1, 828-2) also include one or more gate structures 831 (so called assist gate) disposed between the n-type and p-type regions and the active strips (e.g., 208-1, 208-2 . . . 208-16) extending from the dual-polarity source pads. The assist gate 831 is described in more detail later.

During an erase operation, for example, on a block of the 3D vertical memory array illustrated in FIG. 8 (e.g., block B), all SSL gate structures of the block (e.g., 229-1, 229-2 . . . 229-8) are turned off (i.e., biased to zero volt or left floating). Negative gate bias voltages are applied to the GSL line (e.g., 827) and word lines (e.g., 225-00, 225-01 . . . 225-63) of the block. The N+ regions of the dual-polarity source pads at all levels of the block (e.g., 221-1, 222-1 . . . 228-1) remain floating. A positive bias (e.g., 10 to 16 volts) is applied to the P+ regions of the dual-polarity source pads at all levels of the block. The positive-biased P+ regions (of the dual-polarity source pads) generate holes that are pushed through the active strips (i.e., channels of the memory cells of the block) during the erase operation. In this way, the memory cells of the block operate in p-channel mode during the erase operation.

During the example erase operation, the assist gate 831 remains floating or is biased to a negative voltage. The assist gate 831 can be biased from below 0 volts to −4 volts. If a negative bias voltage is applied to the assist gate 831, holes accumulate under the assist gate 831 in the dual-polarity source pads forming a conduction path for holes from the P+ regions to the active strips.

Figure 9:
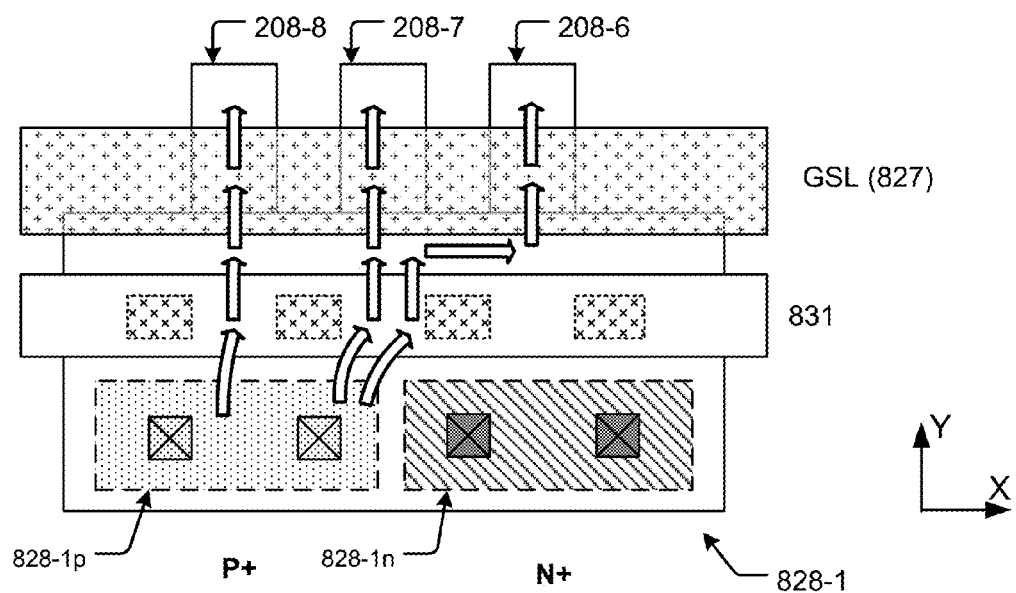
FIG. 9 illustrates example current path during an erase operation of a 3D vertical gate memory array including dual-polarity source pad structures.

FIG. 9 illustrates example current path during an erase operation of the 3D vertical gate memory array including dual-polarity source pad structures illustrated in FIG. 8. As described above, a positive bias is applied to the P+ region (828-1p) of the dual-polarity source pad 828-1 during an erase operation. Meanwhile, the N+ region (828-1n) remains floating. The positive-biased P+ region generates erase currents comprising holes. The erase current pass through channel regions the assist gate 831 and to the active strips (e.g., 208-6, 208-7, 208-8), as illustrated by the arrows in FIG. 9.

During a read operation for example on a selected active strip of the 3D vertical memory array illustrated in FIG. 8, the selected active strip is biased to a positive voltage (e.g., 1V) at the end of bit line pads. Meanwhile, unselected active strips are biased to zero voltage. Selected word lines are biased to a reference voltage that can be used to distinguish between an erase state and a programmed state of memory cells in the 3D vertical memory array. Unselected word lines are bias to a pass voltage that causes unselected memory cells (e.g., at the cross-points of the selected active strip and unselected word lines) operate as closed pass gates (i.e., always conducting). The SSL gate structure corresponds to the selected active strip is biased to a positive reference voltage. SSL gate structures that do not include a selected active strip are biased to zero voltage. The GSL line including the selected active strip is biased to a positive reference voltage. The assist gate 831 is turned on (e.g., by applying a positive voltage) for electron current.

During the example read operation, the N+ regions of the dual-polarity source pad connected to the selected active strip is biased to zero voltage, while the P+ region of the dual-polarity source pad remains floating. With the potential difference between the bit-line-pad end (biased to 1V) and the dual-polarity source-pad end (the N+ regions are biased to 0V) of the selected active strip, a read current can flow through the selected active strip, toward the N+ regions of the dual-polarity source-pad.

Figure 10:
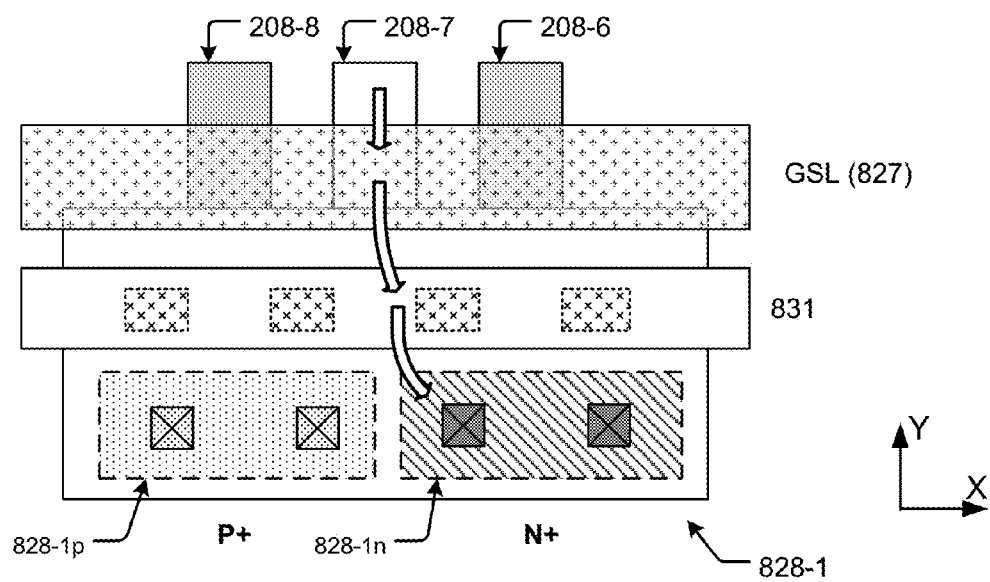
FIG. 10 illustrates example current path during a read operation of a 3D vertical gate memory array including dual-polarity source pad structures.

FIG. 10 illustrates example current path during a read operation of the 3D vertical gate memory array including dual-polarity source pad structures illustrated in FIG. 8. As described above, a zero bias is applied to the N+ regions (828-1n) of the dual-polarity source pad 828-1 during a read operation. Meanwhile, the P+ region (828-1p) remains floating. In this example, active strip 208-7 is a selected for the read operation, while active strips 208-6 and 208-8 are not selected for the read operation. As illustrated by the arrows shown in FIG. 10, a read current flows through the selected active strip 208-7 (i.e., channels of the memory cells along the selected active strip 208-7) if the selected memory cell is in an erased state. The read current flows through the selected active strip 208-7 from the corresponding bit line pad (not shown) and channel regions of the assist gate 831, to the zero-biased N+ regions of the corresponding dual-polarity source pad. Since the N+ regions are zero-biased, or negatively biased relative to the selected active strip, the charge carriers of the read current compose of mostly electrons generated by the negative-biased N+ region. Thus the memory cells along the selected active strip operate in n-channel mode during the example read operation.

During a program operation on selected bits of the 3D vertical memory array illustrated in FIG. 8, the GSL line and the assist gate 831 are biased to zero volt (i.e., turned off). Meanwhile, the P+ regions and N+ regions of the dual-polarity source pads can remain floating.

Figure 11:
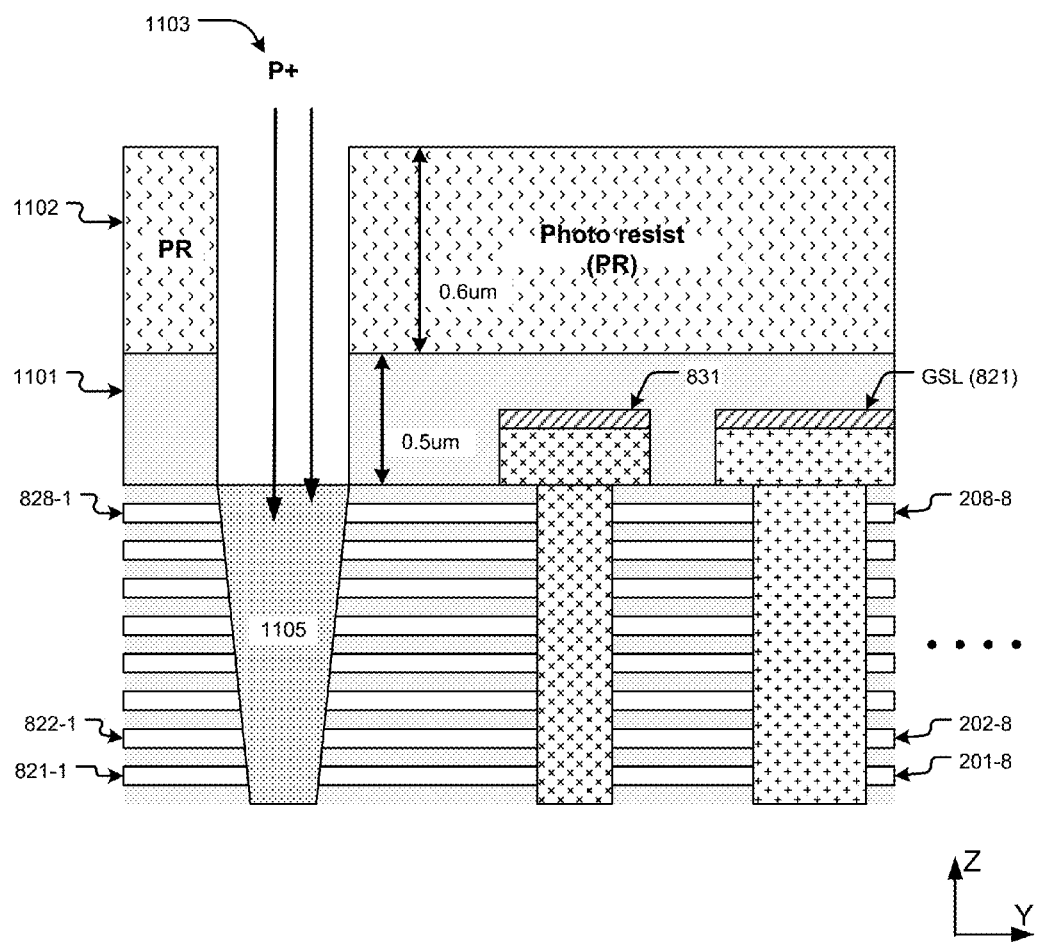
FIG. 11 illustrates a stage in a process for the formation of P+ regions of dual-polarity source pad structures.

FIG. 11 illustrates a stage in a process for the formation of P+ regions of dual-polarity source pad structures. FIG. 11 shows a cross-sectional view through the P+ region 828-1p (in the Y-axis direction) of the dual-polarity source pad 828-1 illustrated in FIG. 8. After the dual-polarity source pads (e.g., 821-1, 822-1 . . . 828-1) and active strips (e.g., 201-8, 202-8 . . . 208-2) of the eight levels of the 3D vertical gate memory array are formed, the GSL line 821 is disposed across and conformal to the active strips. The assist gate 831 is formed on the dual-polarity source pads. A dielectric layer 1101 of about for example 0.5 micrometer in thickness is deposited above the dual-polarity source pads. A layer of photo resist 1102 of about for example 0.6 micrometer in thickness is deposited above the dielectric layer for patterning the dielectric layer. The patterned dielectric layer is used as a masking layer for P+ implantation (1103) into a volume 1105. The volume 1105 extends through the dual-polarity source pads at every level and dielectric layers between the dual-polarity source pads. The P+ doped volume 1105 forms the P+ regions of each level of the dual-polarity source pads and connections between the P+ regions of each level of the dual-polarity source pads.

Figure 12:
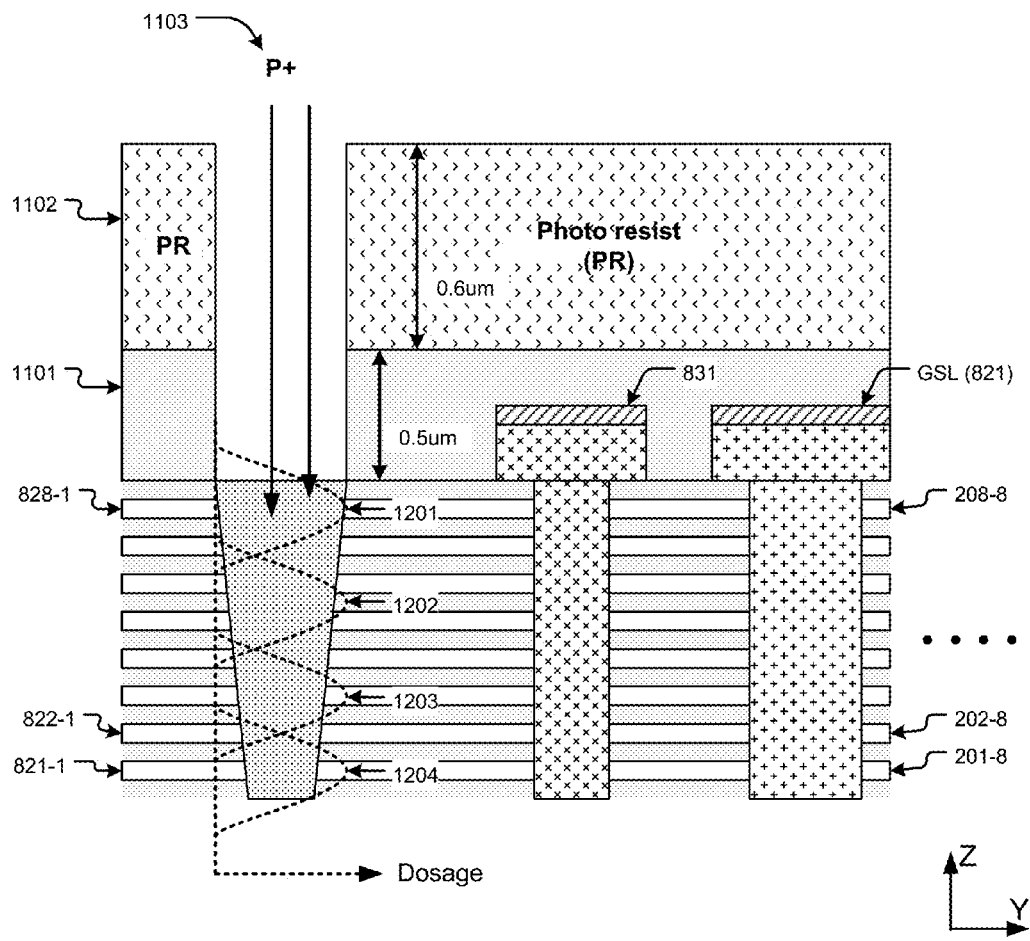
FIG. 12 illustrates implant dosage distributions of P+ implantation process steps used for the formation of P+ regions of dual-polarity source pad structures illustrated in FIG. 11.

The P+ implantation (1103) can include multiple implantation steps. Each step can have a different setting in dosage and implantation energy. FIG. 12 illustrates implant dosage distributions of the P+ implantation illustrated in FIG. 11. In this example, the P+ implantation (1103) has four implantation steps with successive stronger implantation energy. The four implantation steps use the same masking layer (as defined by the opening of the dielectric layer 1101). FIG. 12 shows dosage distributions of the first implantation step (distribution 1201), the second implantation step (distribution 1202), the third implantation step (distribution 1203), and the fourth implantation step (distribution 1204). A thermal anneal (e.g., contact anneal) process step can be used after the P+ implantation steps to improve doping uniformity (in the z-direction) among the eight levels of the dual-polarity source pads.

The N+ regions of the dual-polarity source pads of the 3D vertical memory array of FIG. 8 can be formed in a similar way using N+ implantation. The process method described by FIG. 11 can also applied to forming P+ or N+ regions of other dual-polarity source pads described in this disclosure.

The present technology in the vertical gate memory array with dual-polarity source pad structures described with FIG. 8 can be embodied in a single level array, or in a single strip of semiconductor material. For example, the memory array can include only a single level, such as the top level illustrated in FIG. 8, including the source line pads (dual-polarity source pad) 828-1 and 828-2, the bit line pads 218-1 and 218-2, and the active strips 208-1, 208-2 . . . 208-16. The memory array includes word lines 225-01, 225-02 . . . 225-63 coupled to the active strips 208-1, 208-2 . . . 208-16. As described earlier, each active strip acts as channels of a NAND string and is junction-free between the word lines. The memory array also includes string select line SSL gate structures (e.g., 229-1, 229-2 . . . 229-16) between the word lines and the bit line planes, and a ground select line GSL structure (e.g., 827) between the word lines and the source line pads. The source line pads also includes an assist gate structure (e.g., 831), including an assist gate channel region disposed between the active strips and the n-type regions, an assist gate channel region disposed between the active strips and the p-type regions, and an assist gate with conductor coupled to the assist channel regions. The at least one n-type region and the at least one p-type region of the source line pads 228-1 and 228-2 are coupled to a circuitry that is configured to enable current flow in the active strips through one of the n-type region or the p-type region.

Figure 13:
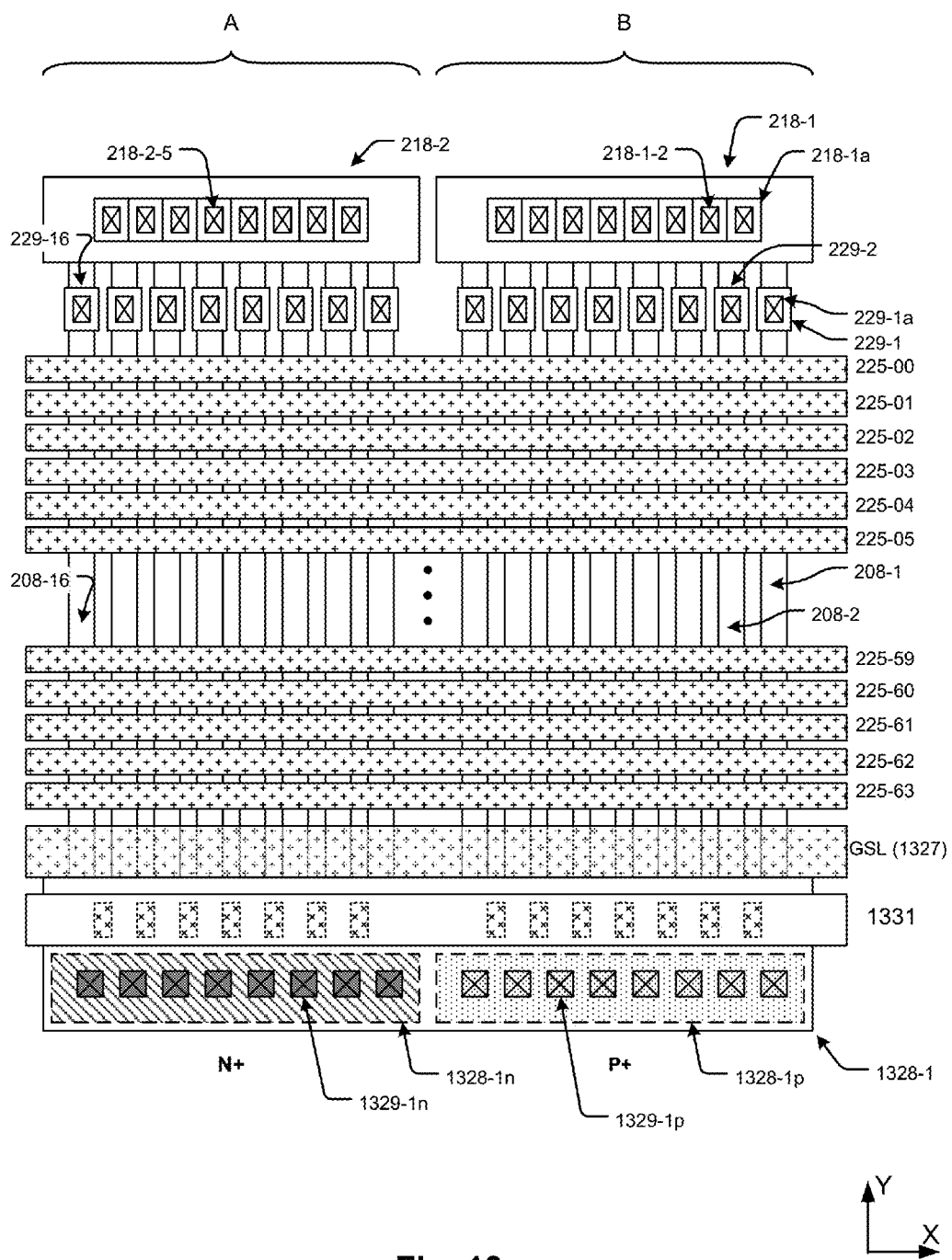
FIG. 13 is a layout view of a 3D vertical gate memory array including dual-polarity source pad structures.

For another example, the memory array can include a single active strip 208-7 between the source line pad (dual-polarity source pad) 828-1 and the bit line pad 218-1. The memory array includes at least a gate (e.g., word line 225-63) coupled to the active strip 208-7. A memory cell is formed with a data storage element between the gate and the active strip 208-7. The memory array also includes a string select line SSL gate structure (e.g., 229-7) controlling electrical connection between the active strip 208-7 and the bit line pad 218-1, and a ground select line GSL gate structure (e.g., 827) controlling electrical connection between the active strip 208-7 and the source line pad 828-1. The at least one n-type region and the at least one p-type region of the source line pad 828-1 are coupled to a circuitry that is configured to enable current flow in the active strips through one of the n-type region or the p-type region FIG. 13 is a layout view of a 3D vertical gate memory array including dual-polarity source pad structures. FIG. 13 illustrates another embodiment of dual-polarity source pad structures for the 3D vertical gate memory array illustrated in FIG. 2. In the example of FIG. 13, the 3D vertical gate memory array includes two memory cell blocks (block A and block B). Each block has eight stacks of active strips eight levels deep. The active strips (e.g., 208-1, 208-2 . . . 208-16), word lines (e.g., 225-00, 225-01 . . . 225-63), SSL gate structures (e.g., 229-1, 229-2 . . . 229-16), interlayer connectors (e.g., 229-1a) coupling the SSL gate structures to overlying SSL lines, bit line pads (e.g., 218-1, 218-2), stairstep structure (e.g., 218-1a), and interlayer connectors (e.g., 218-1-2, 218-2-5) connecting the landing pads of the stairstep structure and overlying bit lines, have the same structures as the 3D vertical gate memory array illustrated in FIG. 2.

In the example of FIG. 13, active strips (and associated memory cells) at a particular level of two or more blocks (e.g., blocks A and block B) extend from the same dual-polarity source pad at the particular level to corresponding bit line pads at the particular level. For example, the top-level active strips of the block A and block B (e.g., 208-1, 208-2 . . . 208-16) extend from the top-level dual-polarity source pad 1328-1 to their respective top-level bit line pads (218-1 or 218-2).

In this example, the dual-polarity source pad at a particular level of the 3D vertical gate memory array includes a p-type region and an n-type region. The n-type region and the p-type region are coupled to circuitry that is configured to selectively enable current flow in the active strips extending from the dual-polarity source pad and one of the n-type region and the p-type region. For example, the top-level dual-polarity source pad 1328-1 includes a P+ region 1328-1p and an N+ region 1328-1n. The P+ region have higher p-type impurity concentration than active strips extending from the dual-polarity source pad. The N+ region have higher n-type impurity concentration than active strips extending from the dual-polarity source pad.

The top-level dual-polarity source pad includes one or more interlayer connectors (e.g., 1329-1n) that connect the N+ region to overlying control lines in a patterned conductor layer (e.g., ML2). The top-level dual-polarity source pad includes one or more interlayer connectors (e.g., 1329-1p) that connect the P+ region to overlying control lines in a patterned conductor layer (e.g., ML2).

In another embodiment, each dual-polarity source pad includes one or more p-type regions and one or more n-type regions. The p-type regions are disposed on one side (e.g., left side) of the dual-polarity source pad, while the p-type regions are disposed on the other side (e.g., right side) of the dual-polarity source pad.

As illustrated in FIG. 13, the ground select line GSL structure 1327 is disposed across and conformal to the active strips of each block.

The dual-polarity source pads of the 3D vertical gate memory array also include one or more gate structures 1331 (so called assist gate) disposed between the n-type and p-type regions and the active strips extending from the dual-polarity source pads.

FIGS. 14 to 25 illustrate manufacturing process steps for forming the 3D vertical gate memory array illustrated in FIG. 13.

The 3D vertical gate memory array is formed by first forming an oxide and poly silicon stack on an insulator. Then active strips are formed by patterning the oxide and poly silicon stack, as illustrated in FIG. 14.

Figure 14:
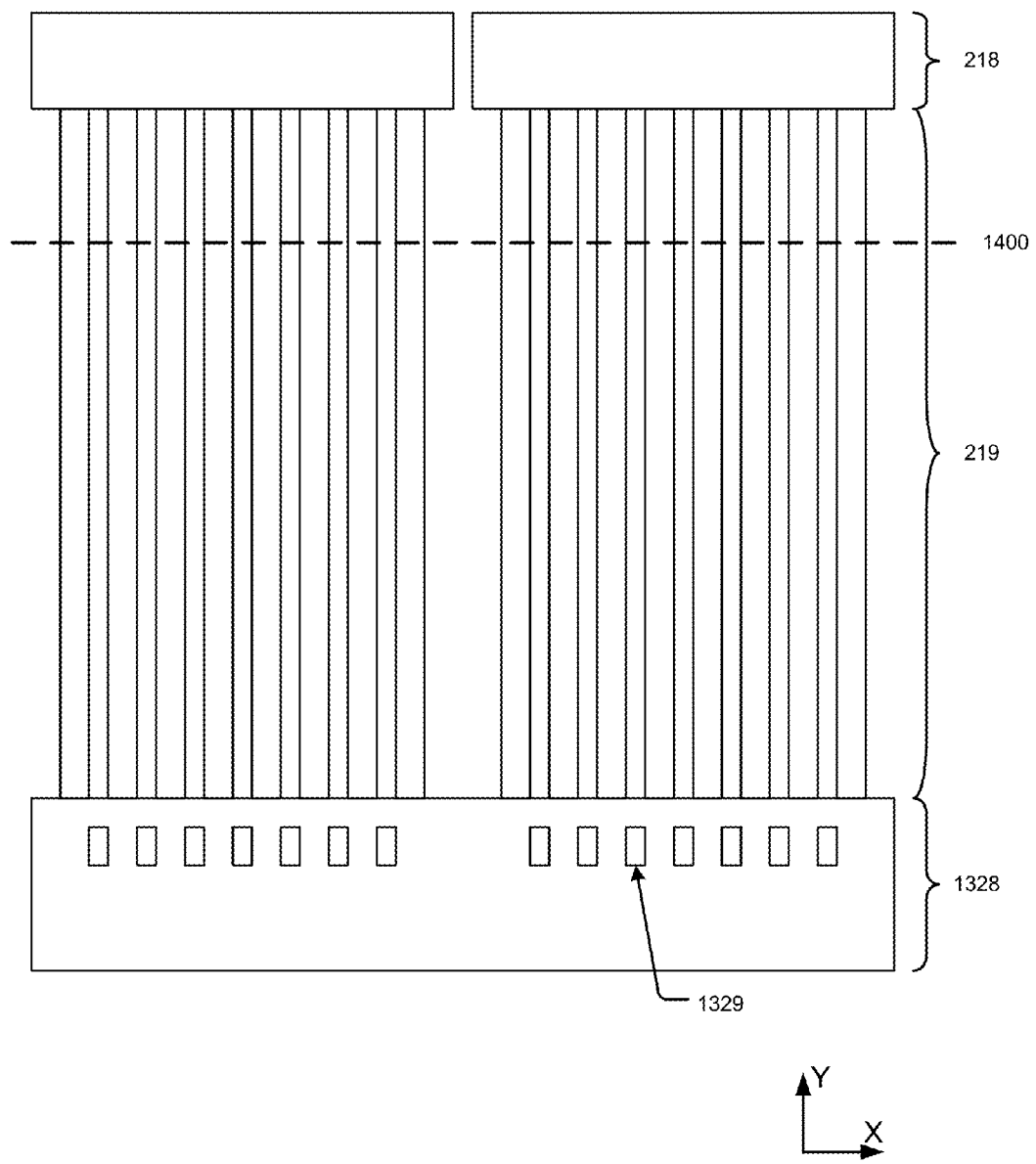
FIGS. 14 and 15 are a top view and a cross-sectional view of active strip patterns for forming a 3D vertical gate memory array.

FIG. 14 is a top view of active strip patterns for forming a 3D vertical gate memory array. FIG. 14 shows respective patterns for bit line planes (region 218), active strips (region 219), and source pads (region 1328). FIG. 14 also shows an array of plug holes (e.g., 1329) that are part of gate structures for an assist gate. A cross-sectional view at the cross section 1400 is illustrated in FIG. 15.

Figure 15:
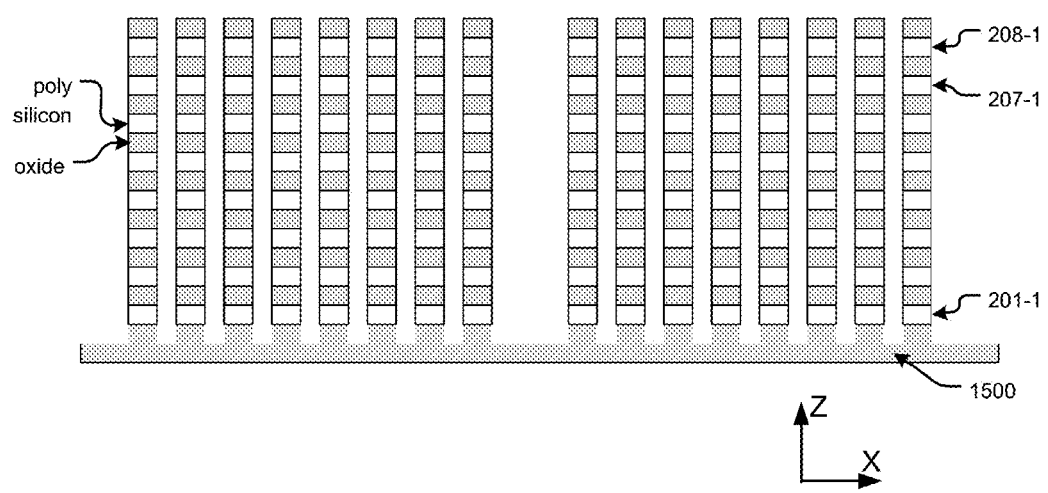

FIG. 15 is a cross-sectional view of the active strip patterns illustrated in FIG. 14. As illustrated in FIG. 15, eight levels of oxide and poly silicon stack are formed and patterned on an insulator 1500. Eight levels of active strips (e.g., 208-1, 207-1 . . . 201-1) composed of the patterned poly silicon are stacked between oxide layers.

Figure 16:
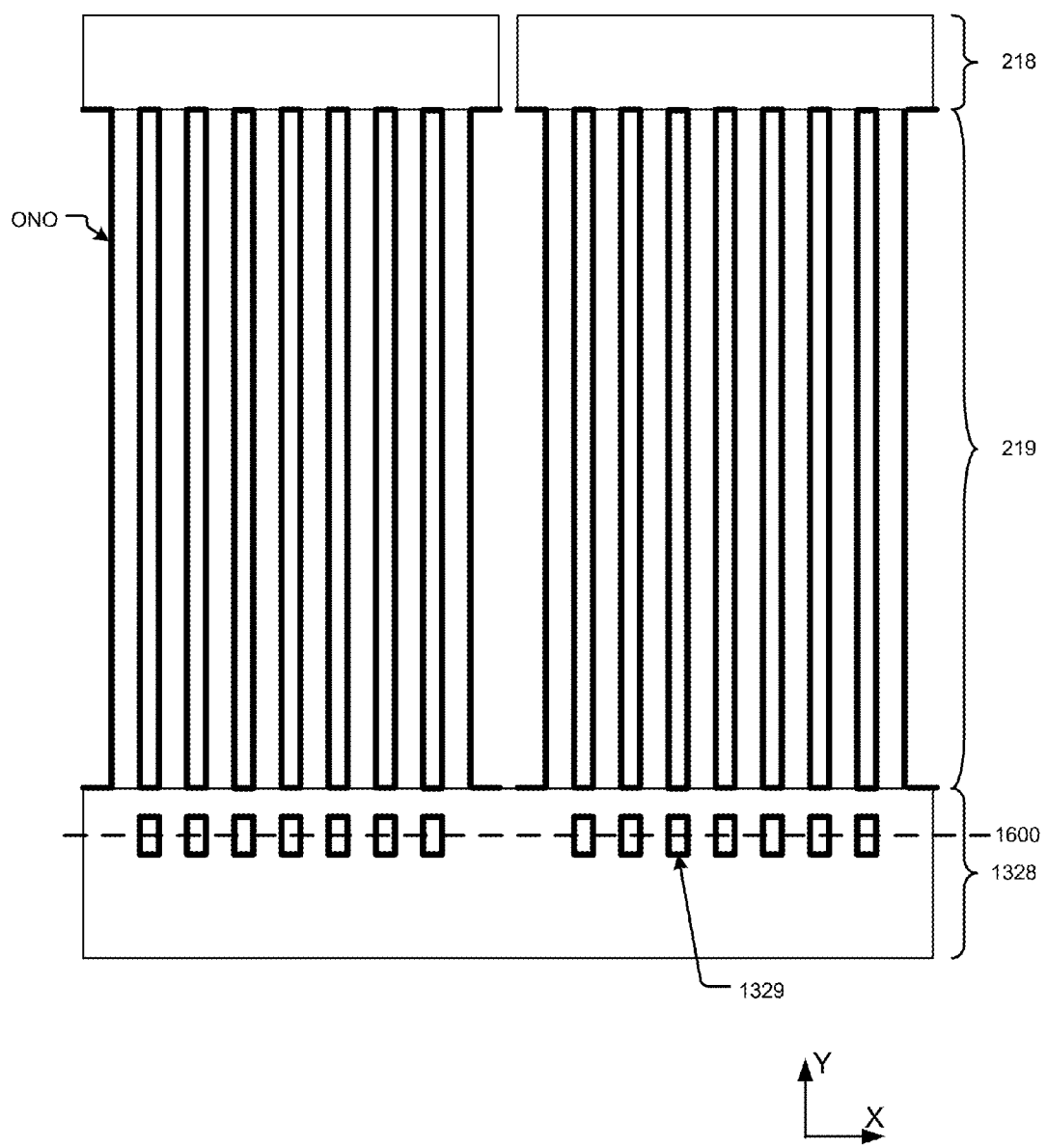
FIG. 16 illustrates an oxide-nitride-oxide layer deposited over active strip patterns for forming a 3D vertical gate memory array.
Figure 17:
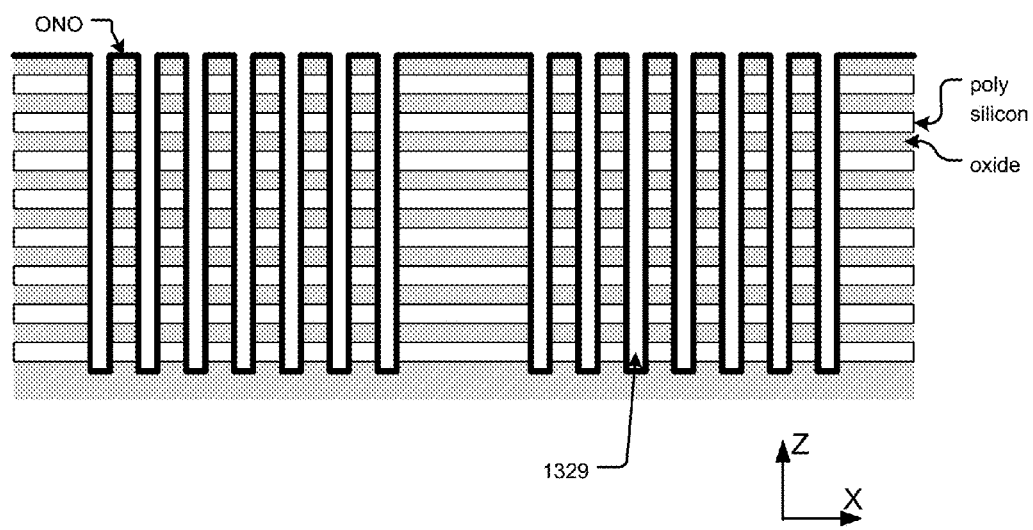
FIG. 17 illustrates an oxide-nitride-oxide layer deposited over an array of hole patterns for forming a 3D vertical gate memory array.

Following the patterning of the oxide and poly silicon stack, a dielectric charge trapping structure comprising for example a first layer of silicon oxide, a layer of silicon nitride and a second layer of silicon oxide (referred to as ONO) is deposited over the active strip patterns and the array of hole patterns, as illustrated by FIGS. 16 and 17.

FIG. 16 illustrates ONO deposition over the active strip patterns and the array of hole patterns illustrated in FIG. 14. In this top view, FIG. 16 shows that ONO (illustrated by the thick boundary lines) is deposited over the patterned active strips (region 219 shown in FIG. 14) and the array of plug holes (e.g., 1329 shown in FIG. 14). The ONO is also deposited on the side walls of the active strip stacks.

FIG. 17 illustrates an oxide-nitride-oxide layer deposited over an array of hole patterns for forming a 3D vertical gate memory array. A cross-sectional view of the array of plug holes (e.g., cross section 1600) is illustrated in FIG. 17. Note that ONO is also deposited on the side walls and bottom surfaces of the plug holes.

Figure 18:
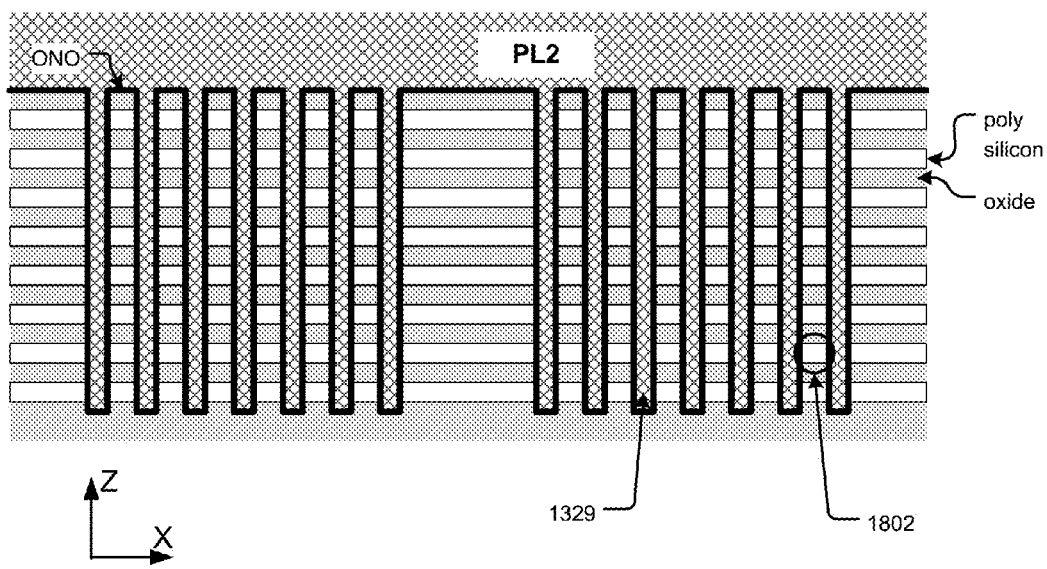
FIG. 18 illustrates poly silicon deposition over an array of hole patterns for forming a 3D vertical gate memory array.

After the ONO deposition, poly silicon (referred to as PL2) is deposited over the bit line planes (region 218 shown in FIG. 14), active strips (region 219 shown in FIG. 14), and the source pads (region 1328 shown in FIG. 14). The PL2 deposition also fills the trenches between the bit lines and the array of plug holes within the source pads. A cross-sectional view of the array of plug holes (at the cross section 1600 shown in FIG. 16) after the PL2 deposition is illustrated in FIG. 18. Here, the plugs filled with the PL2 deposition form the gate structure of the assist gate 1331. The portions of the poly silicon stack between the plugs (e.g., 1802) form the channel regions of the assist gate 1331.

Figure 19:
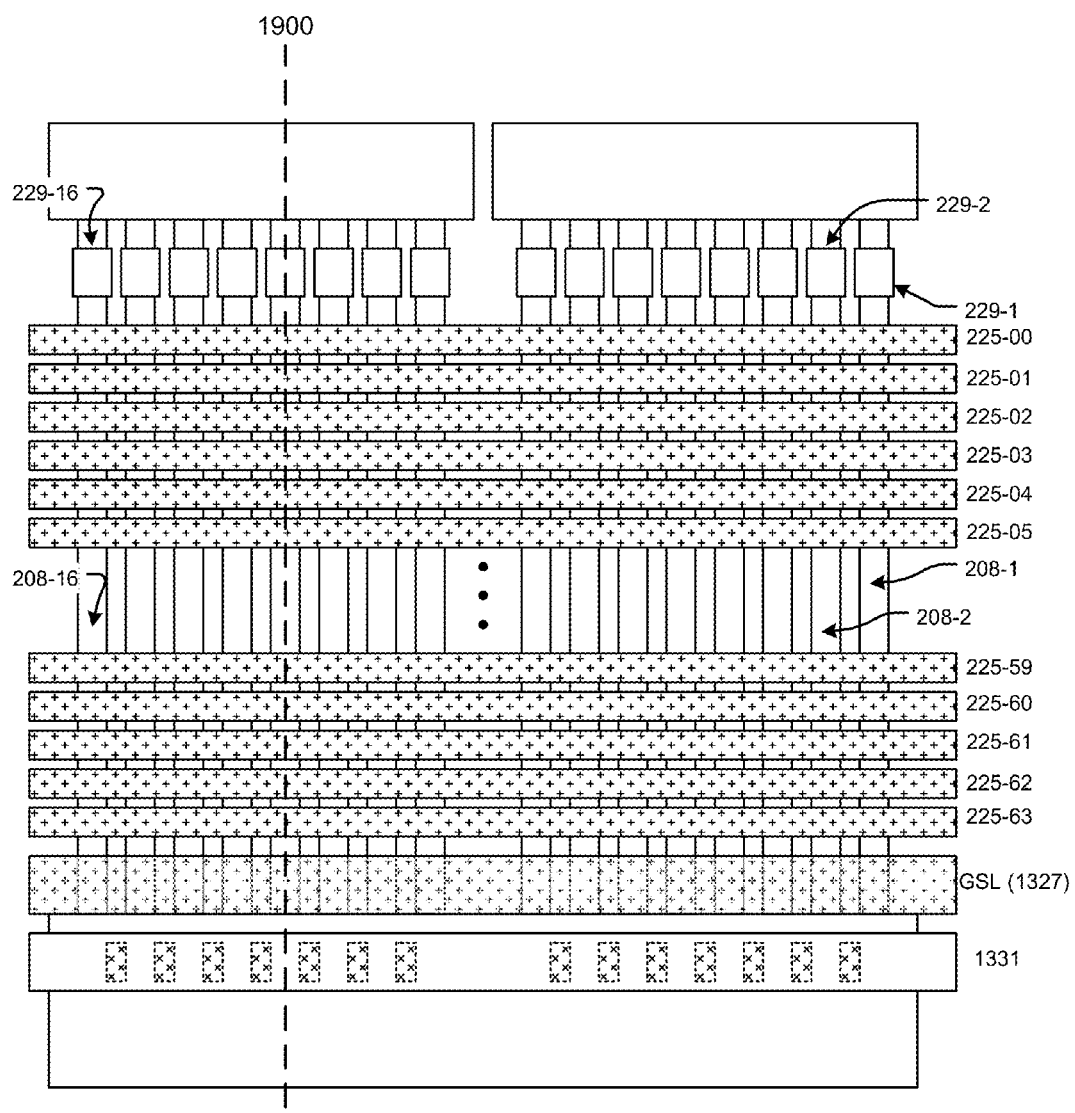
FIG. 19 illustrates word line patterns, string select line pattern, and ground select line pattern for forming a 3D vertical gate memory array.
Figure 20:
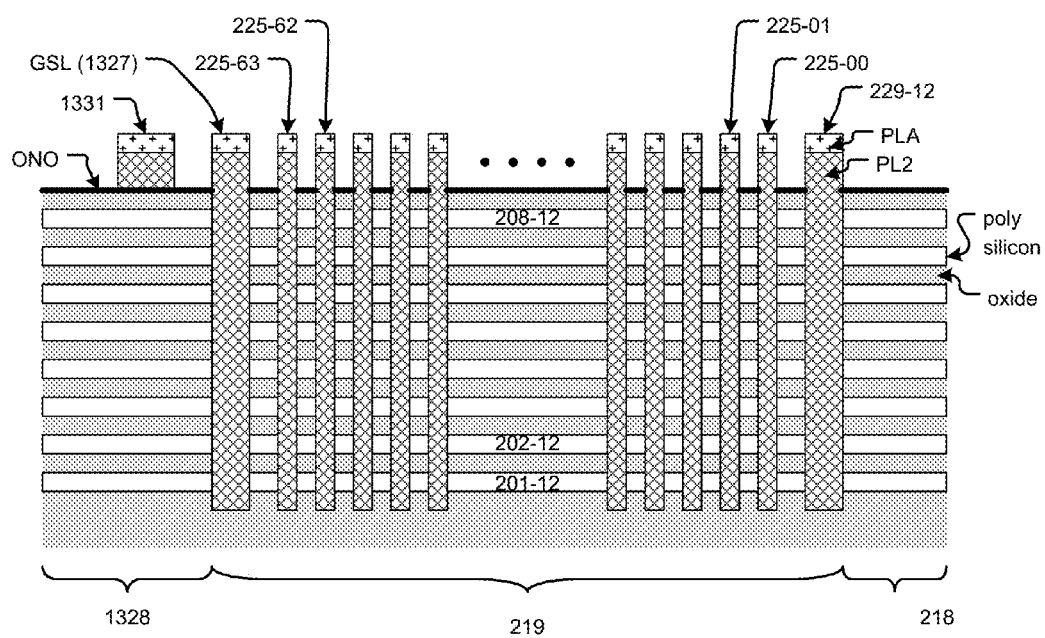
FIG. 20 is a cross-sectional view along an active strip stack of a 3D vertical gate memory array.

After the PL2 deposition, another poly silicon layer (referred to as PLA) is deposited. The PL2 layer and underlying PLA layer than are patterned, forming the word lines (e.g., 225-00, 225-01 . . . 225-63), SSL gate structures (e.g., 229-1, 229-2 . . . 229-16), the ground select line GSL structure 1327, and the assist gate 1331, as illustrated by FIG. 19. A cross-sectional view along an active strip stack (e.g., cross section 1900) is illustrated in FIG. 20. FIG. 20 shows an active strip stack including active strips 201-12, 202-12 . . . 208-12 within the active strip region 219.

Figure 21:
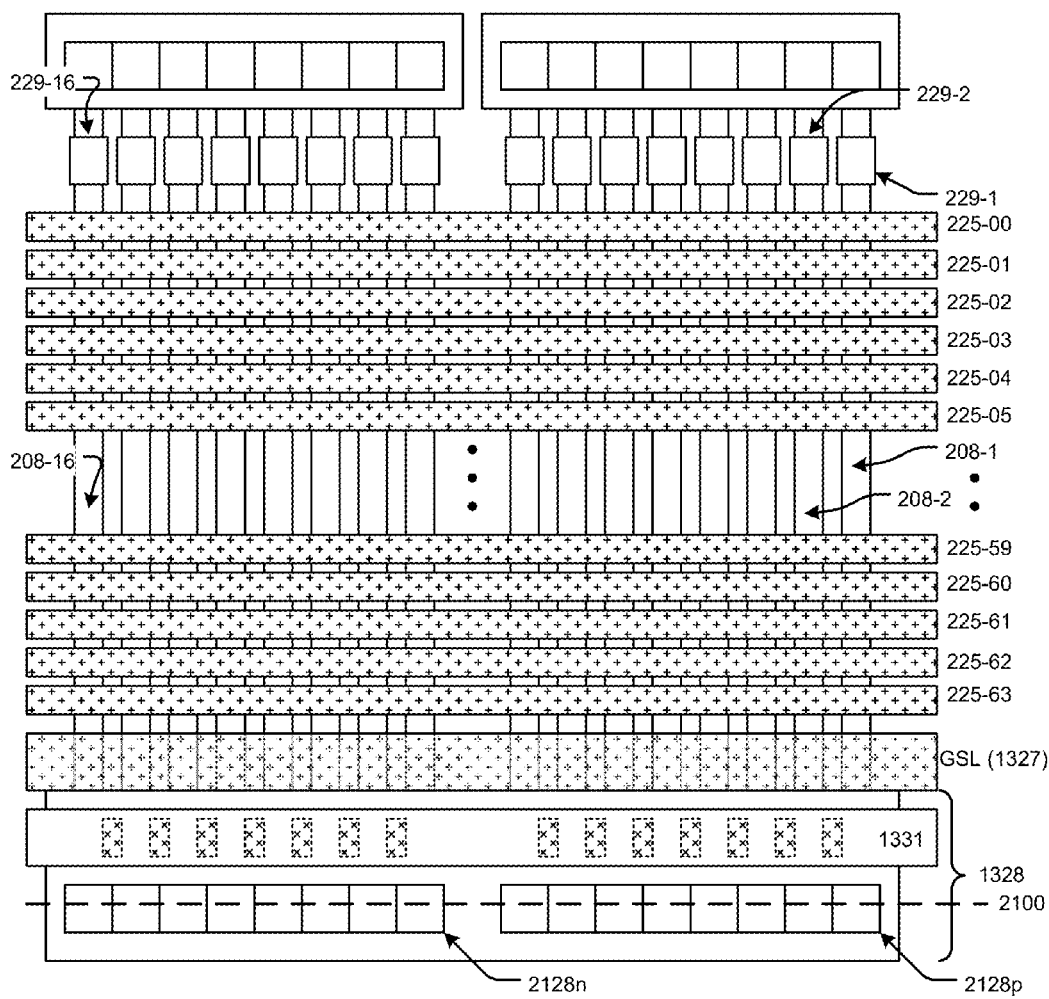
FIGS. 21 and 22 are top view and cross-sectional view of stairstep structures for forming a 3D vertical gate memory array.
Figure 22:
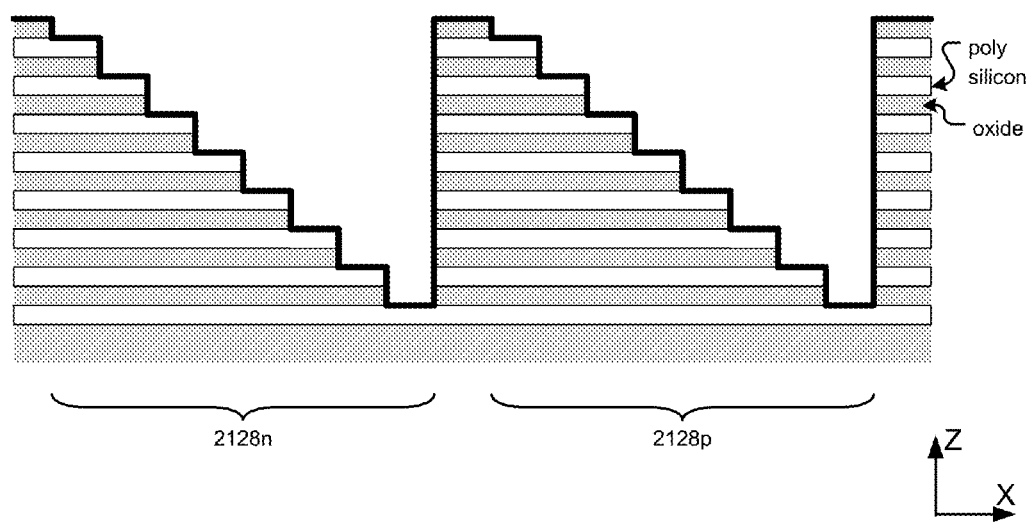

The P+ region 1328-1p and the N+ region 1329-1n of FIG. 13 can be formed by using stairstep contacts. FIG. 21 illustrates stairstep structures 2128p (for the P+ region) and 2128n (for the N+ region) formed in the source pad region 1328. A cross-sectional view of the stairstep structures (e.g., at the cross section 2100) is illustrated in FIG. 22. The stairstep structures can be formed at the same time that the active strip stacks are defined.

Figure 23:
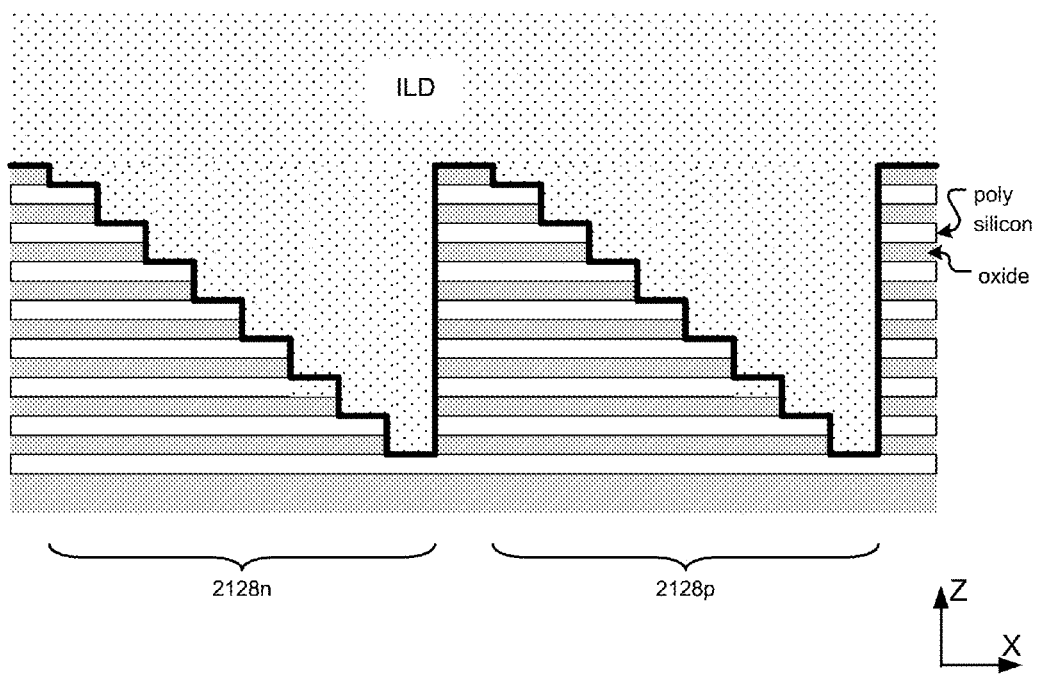
FIG. 23 illustrates forming a dielectric layer on top of stairstep structures for forming a 3D vertical gate memory array.

A dielectric layer (referred to as ILD) is formed on top of the stairstep structures 2128p and 2128n, as illustrated in FIG. 23. In one embodiment, PL2 described earlier can be used as the dielectric formed on top of the stairstep structures 2128p and 2128n.

Figure 24:
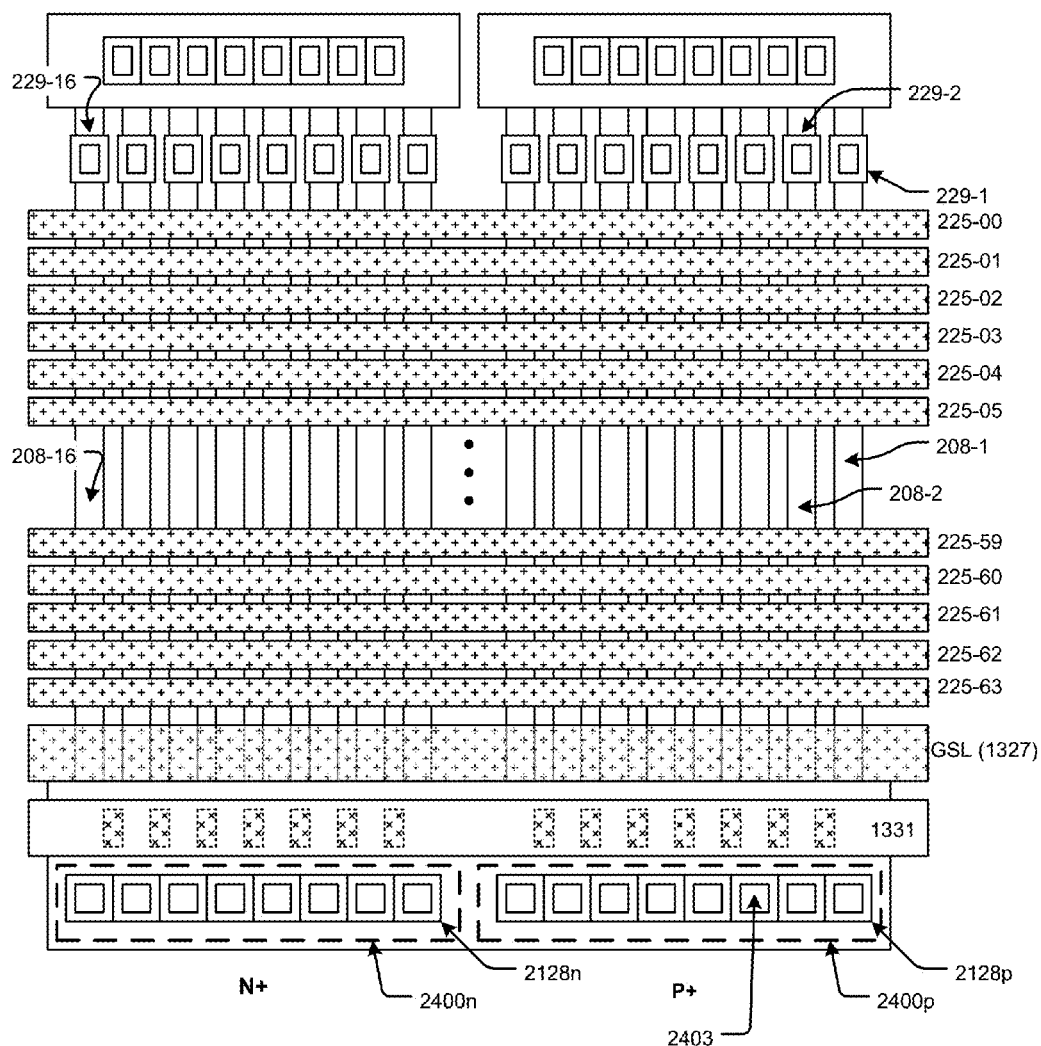
FIGS. 24 and 25 are top view and cross-sectional view of openings to landing areas of stairstep structures for forming a 3D vertical gate memory array.
Figure 25:
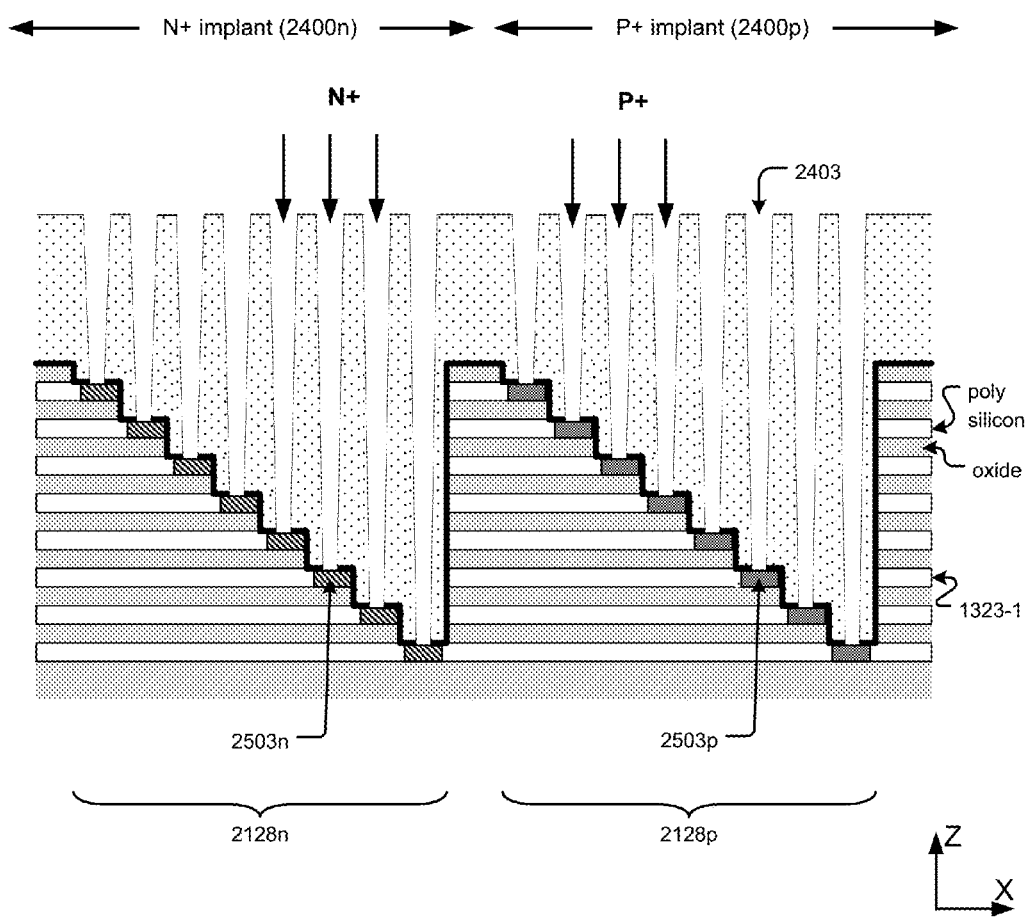

The ILD layer than is patterned, forming openings (e.g., 2403) to landing areas of the stairstep structures 2128p and 2128n, as illustrated by the top view of FIG. 24 and the cross-sectional view of FIG. 25.

After forming the openings, P+ implant is applied to an area 2400p encompassing the openings to the stairstep structure 2128p, forming P+ regions in the source pads. N+ implant is applied to an area 2400n encompassing the openings to the stairstep structure 2128n, forming N+ regions in the source pads. For example, an P+ region 2503p and an N+ region 2503n are formed on the third level source pad 1323-1. In this way, the source pad at each level has both a P+ region and an N+ region, providing a source for p-type or n-type charge carriers, depending on bias arrangements.

After the P+ and N+ implants, connectors (e.g., comprising p-type or n-type semiconductor material) can be formed, filling the openings and connecting respective sources pads to corresponding overlying control lines in a patterned conductor layer (e.g., ML2).

An erase operation on the 3D vertical memory array illustrated in FIG. 13 can be carried out on one or more blocks of active strips (and associated memory cells) that are connected to the same set of dual-polarity source pads (e.g., block A and block B). During an example erase operation on blocks A and block B, all SSL gate structures of the blocks (e.g., 229-1, 229-2 . . . 229-16) are turned off (e.g., biased to zero volt). Negative gate bias voltages are applied to the GSL line (e.g., 1327) and word lines (e.g., 225-00, 225-01 . . . 225-63) of the blocks. For example, a negative bias voltage of below 0 volts to −4 volts can be applied to the GSL line. The N+ regions of the dual-polarity source pads at all levels remain floating. A positive bias (e.g., 10 to 16 volts) is applied to the P+ regions of the dual-polarity source pads at all levels. The positive-biased P+ regions (of the dual-polarity source pads) generate holes that are pushed through the active strips (i.e., channels of the memory cells of the blocks A and B) during the erase operation. In this way, the memory cells operate in p-channel mode during the erase operation.

During the erase operation, the assist gate 1331 is biased to a negative voltage (e.g., from below 0 volts to −4 volts). When a negative bias voltage is applied to the assist gate 1331, holes are formed and accumulated under the assist gate 1331 in the dual-polarity source pads. Similar to the holes generated by the positive-biased P+ regions, the holes formed due to the negative-biased assist gate 1331 are pushed through the active strips during the erase operation.

Figure 26:
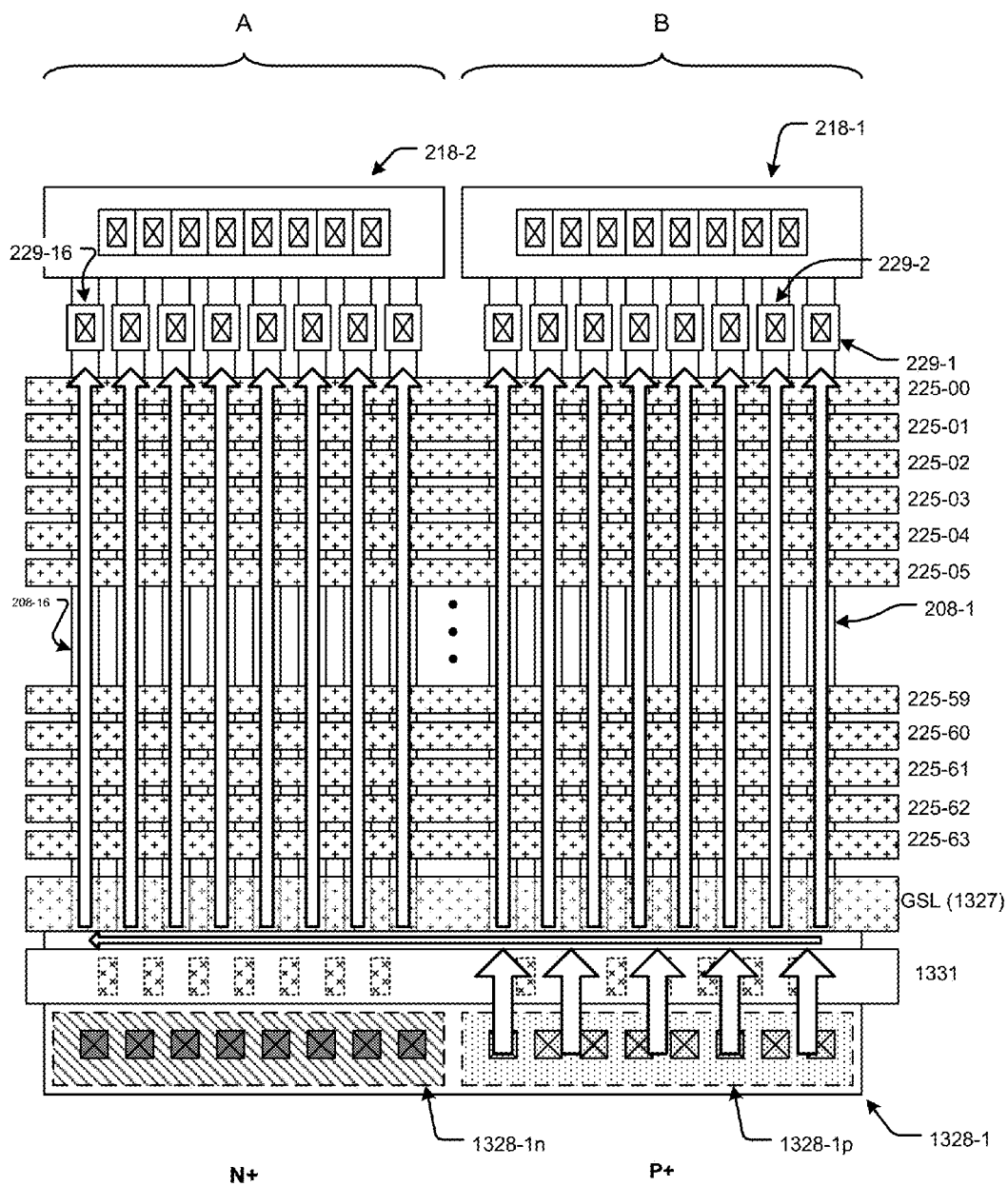
FIG. 26 illustrates example current path during an erase operation of a 3D vertical gate memory array including dual-polarity source pad structures.

FIG. 26 illustrates example current path during an erase operation of the 3D vertical gate memory array including dual-polarity source pad structures illustrated in FIG. 13. As described above, a positive bias is applied to the P+ region (1328-1p) of the dual-polarity source pad 1328-1 during an erase operation. Meanwhile, the N+ region (1328-1n) remains floating. The positive-biased P+ region generates erase currents that mostly compose of holes as charge carriers. The erase currents are push down through the assist gate 1331 and down through the active strips (e.g., 208-1, 208-2 . . . 208-16), as illustrated by the arrows in FIG. 26.

During an example read operation on a selected active strip of the 3D vertical memory array illustrated in FIG. 13, the selected active strip is biased to a positive voltage (e.g., 1V) at the end of bit line pads. Meanwhile, unselected active strips are biased to zero voltage. Selected word lines are biased to a reference voltage that can be used to distinguish between an erase state and a programmed state of memory cells in the 3D vertical memory array. Unselected word lines are bias to a pass voltage that causes unselected memory cells (e.g., at the cross-points of the selected active strip and unselected word lines) operate as closed pass gates (i.e., always conducting). The SSL gate structure corresponds to the selected active strip is biased to a positive reference voltage. SSL gate structures that do not include a selected active strip are biased to zero voltage. The GSL line 1327 is biased to a positive reference voltage. The assist gate 1331 is turned on (e.g., by applying a positive voltage).

During the read operation, the N+ regions of the dual-polarity source pad connected to the selected active strip is biased to zero voltage, while the P+ region of the dual-polarity source pad remains floating. With the potential difference between the bit-line-pad end (biased to 1V) and the dual-polarity source-pad end (the N+ regions are biased to 0V) of the selected active strip, a read current can flow through the selected active strip, toward the N+ regions of the dual-polarity source-pad.

Figure 27:
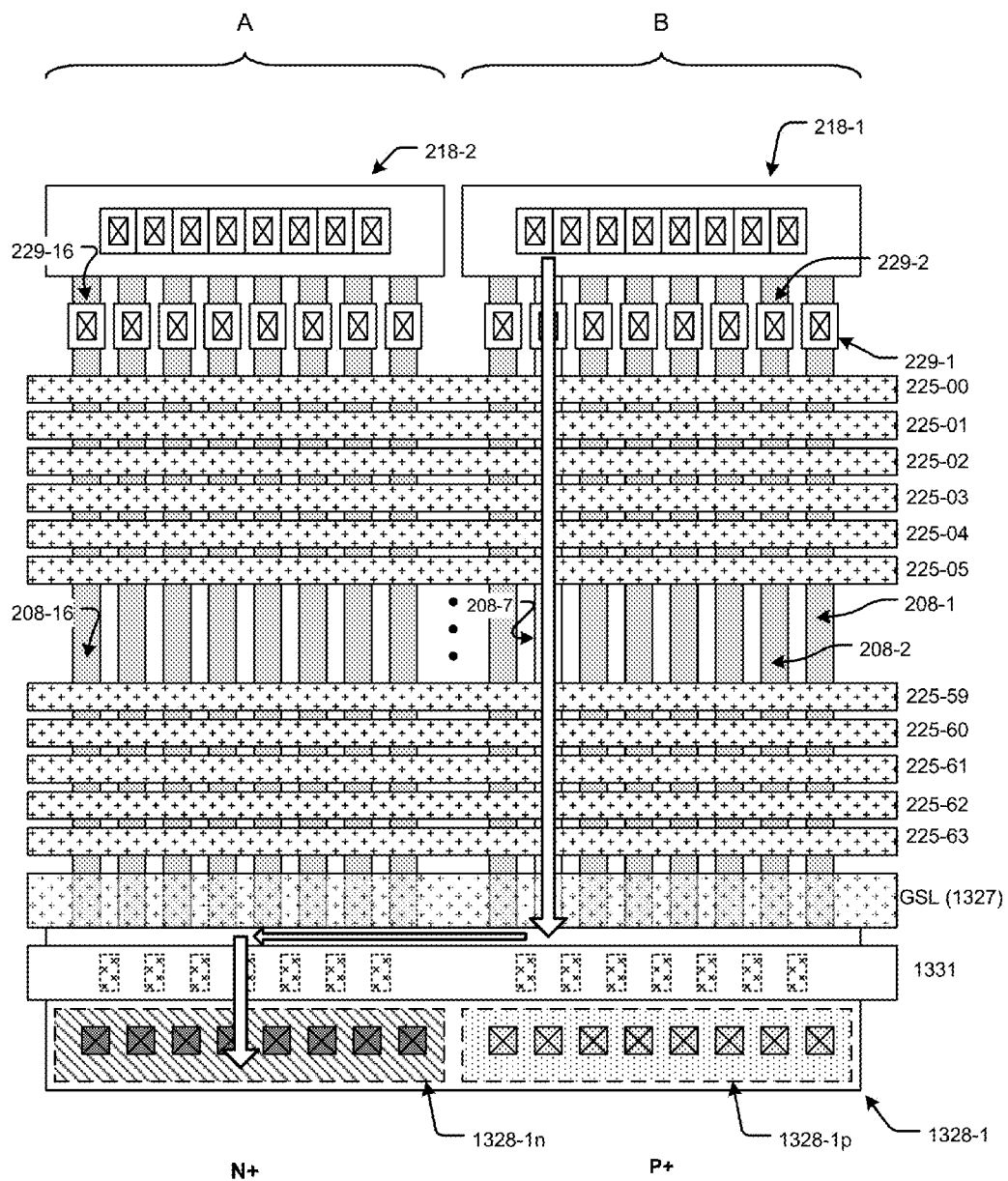
FIG. 27 illustrates example current path during a read operation of a 3D vertical gate memory array including dual-polarity source pad structures.
Figure 27:

FIG. 27 illustrates example current path during a read operation of the 3D vertical gate memory array including dual-polarity source pad structures illustrated in FIG. 13. As described above, a zero bias is applied to the N+ regions (1328-1n) of the dual-polarity source pad 1328-1 during a read operation. Meanwhile, the P+ region (1328-1*p*) remains floating. In this example, active strip 208-7 is a selected for the read operation, while other active strips (208-1, 208-2 . . . , 208-6, and 208-8, 208-9 . . . 208-16) are not selected for the read operation. As illustrated by the arrows shown in FIG. 27, a read current flows through the selected active strip 208-7 if the selected memory cell is in an erased state. The read current flows through the selected active strip 208-7 from the corresponding bit line pad (218-1) to the zero-biased N+ regions of the dual-polarity source pad. Since the N+ regions are zero-biased, or negatively biased relative to the selected active strip, the charge carriers of the read current composed of mostly electrons generated by the negative-biased N+ region. Thus the memory cells along the selected active strip operate in n-channel mode.

During a program operation on selected bits of the 3D vertical memory array illustrated in FIG. 13, the selected SSL gate structure is biased to a positive reference voltage. The selected active strip is biased to zero voltage at the end next to the bit line pads. The unselected SSL gate structures are biased to zero voltage. The unselected active strips are biased to a positive reference voltage. Selected word lines are biased to a program voltage. Unselected word lines are biased to a pass voltage that causes unselected memory cells (e.g., at the cross-points of the selected active strip and unselected word lines) operate as closed pass gates (i.e., always conducting). The GSL line 1327 and the assist gate 1331 are biased to zero volt (i.e., turned off). Meanwhile, the P+ regions and N+ regions of the dual-polarity source pads remain floating, thus have no effect on the program operation.

Figure 28:
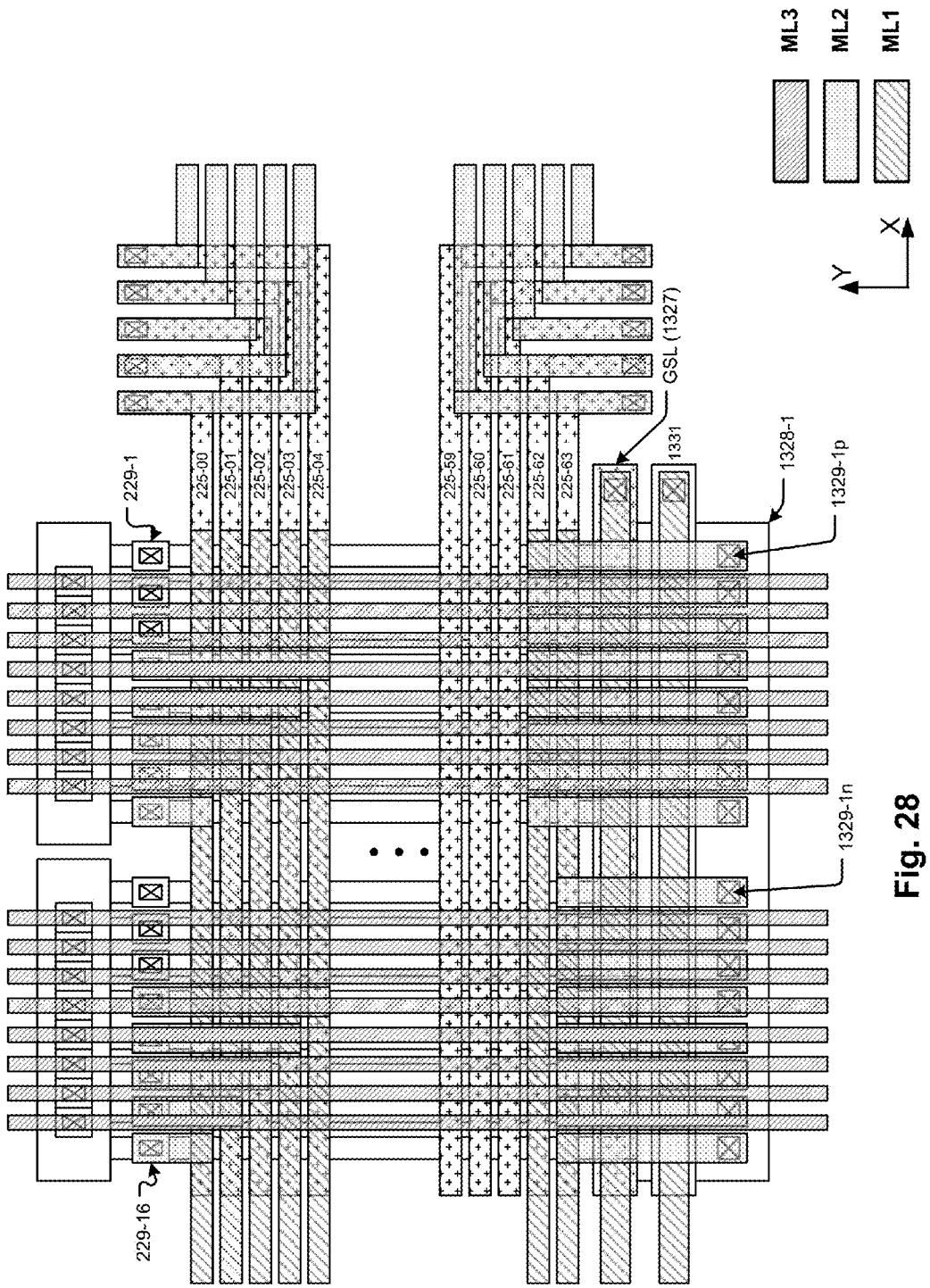
FIG. 28 illustrates an example routing overlying a 3D vertical gate memory array including dual-polarity source pad structures.

FIG. 28 illustrates an example routing overlying a 3D vertical gate memory array including dual-polarity source pad structures. FIG. 28 shows routings using patterned conductor layers metal 1 (ML1), metal 2 (ML2), and metal 3 (ML3) overlying the 3D vertical gate memory array illustrated in FIG. 13. The conductor layers ML1, ML2, and ML3 are part of so-called back-end-of-line (BEOL) metal layers. In this example, word lines (e.g., 225-00, 225-01, and so on) are extended to the side of the active strip array and connected to overlying ML2 routings (e.g., for connection to global word lines). SSL gates (e.g., 229-1, 229-2, and so on) are connected to ML2 and ML1 routings (e.g., for connection to control lines). GSL line 1327 and assist gate 1331 are connected to respective overlying ML1 routings. The P+ and N+ regions of the dual-polarity source pad 1328-1 are connected through respective interlayer connectors (e.g., 1329-1*p*, 1329-1*n*) to overlying ML2 and ML1 routings, which in turn are coupled to circuitry that is configured to selectively enable current flow in the active strips of the 3D vertical gate memory array illustrated in FIG. 13 as described earlier.

The present technology in the vertical gate memory array with dual-polarity source pad structures described with FIG. 13 can be embodied in a single level array, or in a single strip of semiconductor material. For example, the memory array can include only a single level, such as the top level illustrated in FIG. 8, including the source line pad (dual-polarity source pad) 1328-1, the bit line pads 218-1 and 218-2, and the active strips 208-1, 208-2 . . . 208-16. The memory array includes word lines 225-01, 225-02 . . . 225-63 coupled to the active strips 208-1, 208-2 . . . 208-16. As described earlier, each active strip acts as channels of a NAND string and is junction-free between the word lines. The memory array also includes string select line SSL gate structures (e.g., 229-1, 229-2 . . . 229-16) between the word lines and the bit line planes, and a ground select line GSL structure (e.g., 1327) between the word lines and the source line pads. The source line pads also includes an assist gate structure (e.g., 1331), including an assist gate channel region disposed between the active strips and the n-type regions, an assist gate channel region disposed between the active strips and the p-type regions, and an assist gate with conductor coupled to the assist channel regions. The at least one n-type region and the at least one p-type region of the source line pad 1328-1 are coupled to a circuitry that is configured to enable current flow in the active strips through one of the n-type region or the p-type region.

Figure 29:
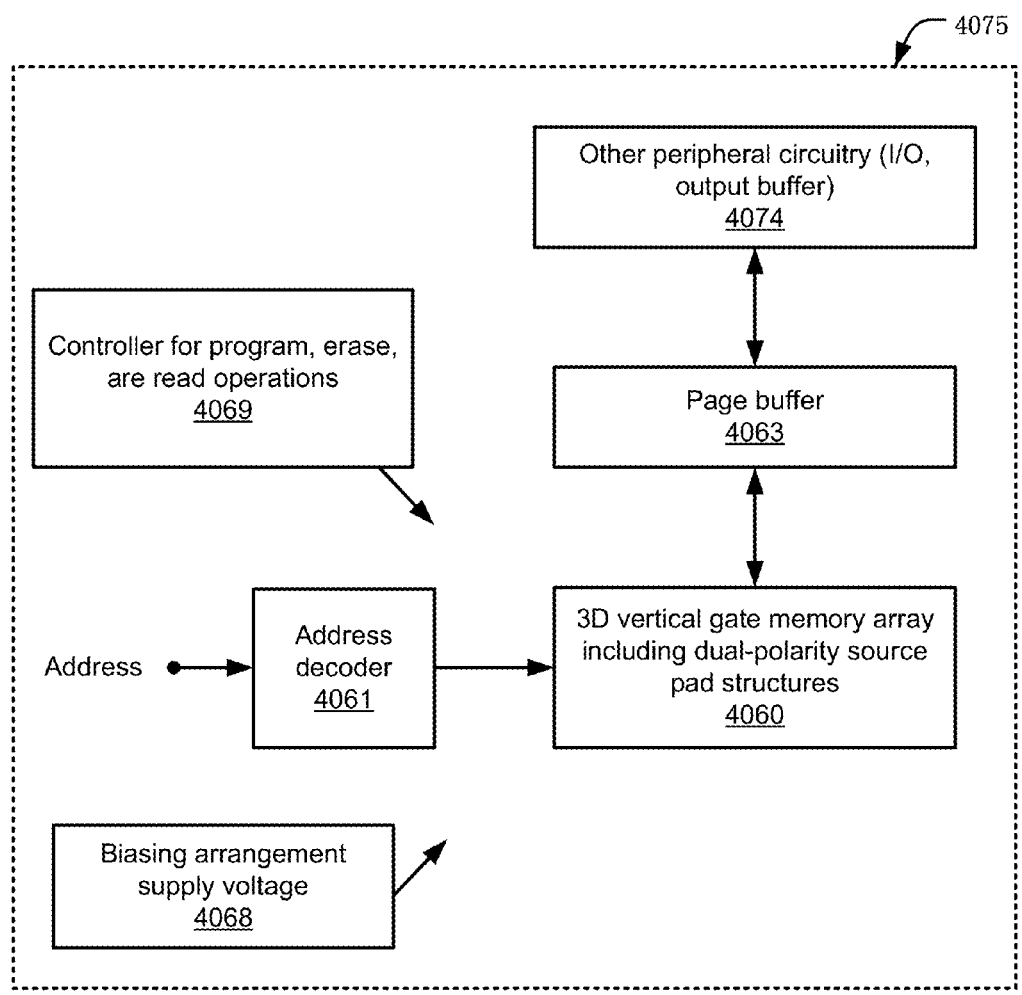
FIG. 29 is a simplified block diagram of an integrated circuit including a memory.

For another example, the memory array can include a single active strip 208-7 between the source line pad 1328-1 and the bit line pad 218-1. The memory array includes at least a gate (e.g., word line 225-63) coupled to the active strip 208-7. A memory cell is formed with a data storage element between the gate and the active strip 208-7. The memory array also includes a string select line SSL gate structure (e.g., 229-7) controlling electrical connection between the active strip 208-7 and the bit line pad 218-1, and a ground select line GSL gate structure (e.g., 1327) controlling electrical connection between the active strip 208-7 and the source line pad 1328-1. The at least one n-type region and the at least one p-type region of the source line pad 1328-1 are coupled to a circuitry that is configured to enable current flow in the active strips through one of the n-type region or the p-type region FIG. 29 is a simplified block diagram of an integrated circuit 4075 including a memory. In this example, the integrated circuit 4075 includes a memory array 4060. The array 4060 can comprise a 3D vertical gate memory array, a single level of memory array, or a single strip memory array, including one or more dual-polarity source pad structures as described herein.

An address decoder 4061 is coupled to the array 4060. Addresses are supplied to the integrated circuit 4075 and provided to the address decoder 4061. The address decoder 4061 can include word line decoders, bit line decoders, and other suitable decoders that decode the supplied addresses and select corresponding memory cells in the array 4060.

Bit lines in the array 4060 are coupled to a page buffer 4063, which in turn is coupled to other peripheral circuitry 4074. The page buffer 4063 can include one or more storage elements (e.g., latches) for each bit line connected. The address decoder 4061 can select and couple specific memory cells in the array 4060 via respective connecting bit lines to the page buffer 4063. The page buffer 4063 can then store data that is written to or read from these specific memory cells.

Peripheral circuitry includes circuits that are formed using logic circuits or analog circuits that are not part of the array 4060, such as the address decoder 4061, the controller 4069, biasing arrangement supply voltage block 4068, and so on. In this example, the block 4074 labeled other peripheral circuitry can include input-output (I/O) circuits, output data buffers, and other circuit components on the integrated circuit 4075, such as a general purpose processor or special-purpose application circuitry, or a combination of modules providing system-on-a-chip functionality supported by the array 4060.

The controller 4069, implemented for example as a state machine, provides signals to control other circuits of the integrated circuit 4075 to carry out the various operations described herein. These operations include program operations, erase operations, and read operations.

Figure 30:
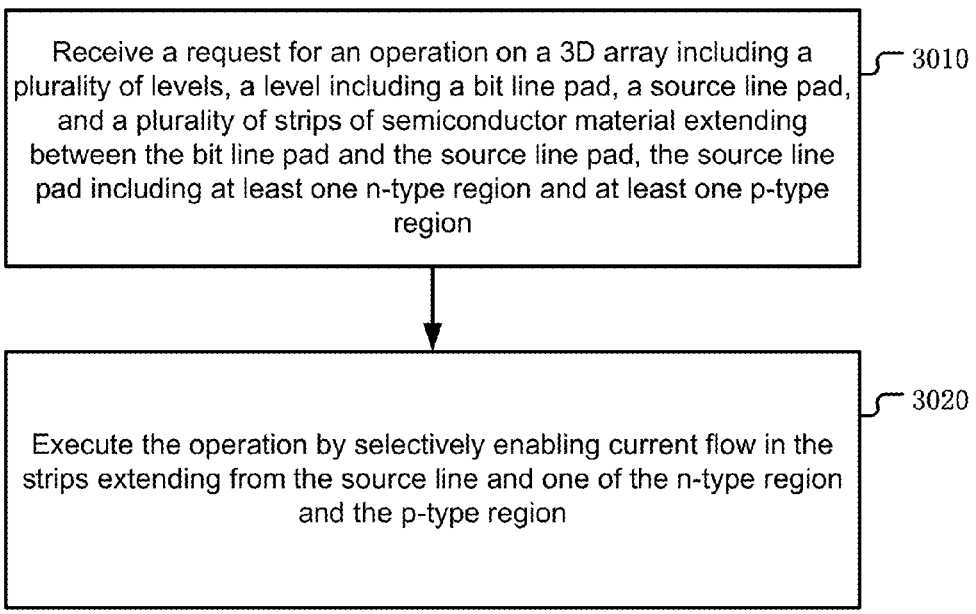
FIG. 30 is a flow chart of a method for operating a memory array including dual-polarity source pad structures.

The controller 4069 can be implemented using special-purpose logic circuitry as known in the art. In other embodiments, the controller comprises a general purpose processor, which may be implemented on the same integrated circuit 4075, which executes a computer program to control the operations of the device. In yet other embodiments, a combi- FIG. 30 is a flow chart of a method for operating a memory array including dual-polarity source pad structures, such as the memory array 4060 of the memory 4075 illustrated in FIG. 29. The method of FIG. 30 can be implemented by the controller 4069, biasing arrangement supply voltage 4068, and other components of the memory 4075. In this example, the method of FIG. 30 starts at Step 3010. At Step 3010, the controller 4069 receives a request (e.g., a command code from a system accessing the memory 4075) for an operation on the memory array 4060. For example, the array 4060 can comprise a 3D vertical gate memory array such as described with FIG. 2, 8, or 13. The 3D vertical gate memory array includes a plurality of levels. A level in the plurality of levels includes a bit line pad, a source line pad, and a plurality of strips of semiconductor material extending between the bit line pad and the source line pad. The source line pad includes at least one n-type region and at least one p-type region. The array includes word lines coupled to the plurality of strips in the plurality of levels, and data storage elements are disposed between the word lines and the strips of semiconductor materials. In the array, the memory cells are disposed at cross-points of the strips and the word lines. For another example, the memory array 4060 can comprise a single level of active strips extending between a bit line pad and a source line pad that includes at least one n-type region and at least one p-type region. The active strips are coupled to word lines. Each active strip acts as channels of a NAND string and is junction free between the word lines. For yet another example, the memory array 4060 can comprise a single active strip between a bit line pad and a source line pad that includes at least one n-type region and at least one p-type region. The active strip is coupled to at least a gate (e.g., a word line). A memory cell is formed with a data storage element between the gate and the active strip.

At Step 3020, the controller 4069 executes the operation by selectively enabling current flow in the strips extending from a source line pad and one of the n-type region and the p-type region of the source line pad. For example, if the request is for an erase operation, the controller 4069 causes the biasing arrangement supply voltage 4068 to apply an erase bias arrangement that enables current flow in selected strips extending from the source pad and the p-type region. The erase bias arrangement includes a positive bias on the p-type region, while the n-type region remains floating, the current flow including p-type carriers from the positive-biased p-type region. In this way, the memory cells along the selected strips operate in p-channel mode during the erase operation.

For another example, if the request is for a read operation, the controller 4069 causes the biasing arrangement supply voltage 4068 to apply a read bias arrangement that enables current flow in selected strips extending form the source pad and the n-type region. The read bias arrangement includes a zero-bias on the n-type region, while the p-type region remains floating, the current flow including n-type carriers from the zero-biased n-type region. In this way, the memory cells along the selected strips operate in re-channel mode during the read operation.

While the present technology is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the technology and the scope of the following claims.

What is claimed is:

1. A memory comprising:
   a strip of semiconductor material extending between a bit line pad and a source line pad, the source line pad including at least one n-type region and at least one p-type region;
   a gate coupled to the strip;
   a data storage element between the gate and the strip, whereby a memory cell is disposed at a cross-point of the strip and the gate; and
   circuitry coupled to the n-type region and the p-type region of the source line pad, configured to selectively enable current flow in the strip through one of the n-type region and the p-type region.

2. The memory of claim 1, including a plurality of gates coupled to the strip between the bit line pad and the source line pad, wherein the strip is more lightly doped than the n-type region and the p-type region at least in the cross-points between the strip and the plurality of gates.

3. The memory of claim 2, wherein the strip acts as channel regions for a NAND string of memory cells.

4. The memory of claim 1, including:
   a string select gate coupled to the strip between the gate and the bit line pad, and configured to control electrical connection between the strip and the bit line pad; and
   a ground select gate coupled to the strip between the gate and the source line pad, and configured to control electrical connection between the strip and the source line pad.

5. The memory of claim 1, wherein the source line pad includes an assist gate channel region disposed between the strip and the at least one n-type region, and an assist gate channel region disposed between the strip and the at least one p-type region; and
   an assist gate including conductor coupled to the assist gate channel regions.

6. A memory comprising:
   a three-dimensional array including a plurality of levels, a level in the plurality of levels including a bit line pad, a source line pad, and a strip of semiconductor material extending between the bit line pad and the source line pad, the source line pad including at least one n-type region and at least one p-type region;
   a plurality of word lines coupled to strips in the plurality of levels;
   data storage elements between the word lines and the strips of semiconductor material, whereby memory cells are disposed at cross-points of the strips and the word lines; and
   circuitry coupled to the n-type region and the p-type region of the source line pad, configured to selectively enable current flow in the strips extending from the source line pad and one of the n-type region and the p-type region.

7. The memory of claim 6, wherein the semiconductor strips extending from the source line pad are more lightly doped semiconductor material than the n-type region and the p-type region at least in the cross-points, and the n-type region and the p-type region act as sources of n-type or p-type carriers for the semiconductor strips during operation of the memory.

8. The memory of claim 6, wherein the circuitry is configured to apply an erase bias arrangement that includes a positive bias on the p-type region and enables current flow of p-type carriers from the positive-biased p-type region in the strip extending from the source pad.

9. The memory of claim 6, wherein the circuitry is configured to apply a read bias arrangement that includes a zero-bias on the n-type region and enables current flow of n-type carriers from the zero-biased n-type region in the strip extending from the source pad.

10. The memory of claim 6, wherein the bit line pads are coupled to overlying patterned conductors by interlayer connectors, said overlying patterned conductors being connected to peripheral circuits supporting memory operation.

11. The memory of claim 6, wherein a level in the plurality of levels includes a plurality of strips, and the source line pad includes a plurality of n-type regions, each disposed adjacent to one of the semiconductor strips extending from the source line pad, and a least one p-type region disposed adjacent to one or more of the semiconductor strips extending from the source line pad.

12. The memory of claim 6, wherein a level in the plurality of levels includes a plurality of strips, and the source line pad includes a plurality of p-type regions, each disposed adjacent to one of the semiconductor strips extending from the source line pad, and a least one n-type region disposed adjacent to one or more of the semiconductor strips extending from the source line pad.

13. The memory of claim 6, wherein the source line pad includes an assist gate channel region disposed between the strips extending from the source line pad and the at least one n-type region, and an assist gate channel region disposed between the strip extending from the source line pad and the least one p-type region; and an assist gate including conductor coupled to the assist gate channel regions.

14. The memory of claim 13, wherein the assist gate includes plugs extending through the plurality of levels and assist gate dielectric layer between the plugs and the source line pads in the plurality of levels.

15. The memory of claim 6, wherein the n-type regions and p-type regions in the plurality of levels are coupled to the circuitry by respective interlayer connector stairstep structures.

16. The memory of claim 6, wherein the data storage elements are charge-trapping data storage elements.

17. A method comprising:

forming a strip of semiconductor material extending between a bit line pad and a source line pad, the source line pad including at least one n-type region and at least one p-type region;

forming one or more word lines coupled to the strip;

forming data storage elements between the word lines and the strip, whereby memory cells are disposed at cross-points of the strip and the word lines; and forming circuitry coupled to the n-type region and the p-type region of the source line pad, configured to selectively enable current flow in the strip through one of the n-type region and the p-type region.

18. The method of claim 17, including:

forming a plurality of levels, each level including a plurality of strips of semiconductor material extending from a bit line pad and to a source line pad including at least one n-type region and at least one p-type region, and coupled to the word lines, whereby data storage elements are formed between the word lines and the strips, memory cells are disposed at cross-points of the strips and the word lines, and the circuitry is configured to selectively enable current flow in the strips through one of the n-type region and the p-type region.

19. The method of claim 18, including:

forming a plurality of plug holes through the source line pads of the plurality of levels, the plurality of plug holes disposed between the strips extending from the source line pads and the n-type and p-type regions of the source line pads;

depositing a dielectric layer covering side walls and bottom surfaces of the plug holes;

depositing a conductor over the source line pad at a top level of the plurality of levels, including filling the plug holes with the conductor; and forming an assist gate by patterning the conductor.

20. The method of claim 18, wherein the n-type region or the p-type region of the source line pads of the plurality of levels is formed by:

forming a structure through the plurality of levels, the structure having at least a landing area for the source line pad at each level of the plurality of levels;

forming a dielectric layer on top of the structure;

forming openings through the dielectric layer to the landing areas; and forming doped regions in the source line pads by applying an implant through the openings.

* * * * *